US006612365B1

(12) United States Patent
Saishu et al.

(10) Patent No.: US 6,612,365 B1
(45) Date of Patent: Sep. 2, 2003

(54) HEATING-ELEMENT ACCOMMODATING-BOX COOLING APPARATUS AND METHOD OF CONTROLLING THE SAME

(75) Inventors: Kazuki Saishu, Kanagawa (JP); Mutsuhiko Matsumoto, Kanagawa (JP); Yoshikazu Tada, Kanagawa (JP); Yoshihisa Kobayashi, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/580,538

(22) Filed: May 26, 2000

(30) Foreign Application Priority Data

| Sep. 17, 1999 | (JP) | ......................................... P.11-262958 |
| Dec. 28, 1999 | (JP) | ......................................... P.11-373882 |
| Dec. 28, 1999 | (JP) | ......................................... P.11-373883 |

(51) Int. Cl.[7] ............................................... F24F 13/00
(52) U.S. Cl. ........................... 165/54; 165/47; 165/164; 62/259.1; 454/237
(58) Field of Search ........................... 165/47, 48.1, 50, 165/54, 61, 53, 164; 62/324.1, 259.1, 262; 454/237, 241, 254

(56) References Cited

U.S. PATENT DOCUMENTS

| 4,478,053 A | * | 10/1984 | Yano et al. ..................... 62/262 |
| 4,505,129 A | * | 3/1985 | Yamane et al. ........... 62/262 X |
| 4,600,050 A | | 7/1986 | Noren |
| 4,771,611 A | * | 9/1988 | McNab .................. 62/324.1 X |
| 4,776,180 A | * | 10/1988 | Patton, Sr. et al. ..... 62/324.1 X |
| 5,458,187 A | * | 10/1995 | Davis ........................ 165/54 |
| 6,104,003 A | * | 8/2000 | Jones ........................ 165/61 X |

FOREIGN PATENT DOCUMENTS

| DE | 2059945 | 7/1971 |
| DE | 2085219 | 12/1971 |
| DE | 88 10 288.9 | 9/1988 |
| DE | 38 28 000 A1 | 2/1990 |
| DE | 296 10 284 U1 | 9/1996 |
| DE | 197 01 100 A1 | 7/1998 |
| EP | 0 874 433 A1 | 10/1998 |
| FR | 2576679 | 8/1986 |
| GB | 2 277 767 A | 11/1994 |
| JP | 62-51298 | 3/1987 |
| JP | 01197816 | 8/1989 |
| JP | 05304385 | 11/1993 |
| JP | 6-315848 | 11/1994 |
| JP | 7-100732 | 4/1995 |
| WO | WO 96/41511 | 12/1996 |

OTHER PUBLICATIONS

Hans–Jürgen Heinrich, "Easy Cooling of Equipment Cubicles", Seimens Power Engineering and Automation, Seimens AG. Berlin, DE, vol. 6, No. 3, Sep. 1986, pp. 20–24.

Howard W. Markstein, "Cooling Electronic Equipment Enclosures", Equipment Packaging and Production, Cahners Publishing Co., Newton, Massachusetts, vol. 36, No. 5, May 1996, pp. 558, 60, 62,.64.

* cited by examiner

*Primary Examiner*—Ljiljana Ciric
(74) *Attorney, Agent, or Firm*—Pearne & Gordon LLP

(57) ABSTRACT

A heating-element accommodating-box cooling apparatus includes: an indoor air passage 5 for fetching air in a heating-element accommodating box and returning it to the heating-element accommodating box; an outdoor air passage 9 for fetching outdoor air and exhausting the fetched outdoor air to the outside; a partition plate 10 provided so that both of the air passages become independent of each other; a fan unit 3 for conveying air in the outdoor air passage 9 and the indoor air passage 5; and a heat exchange element 4 disposed at a point of intersection between the two passages to exchange the sensible heat of the outdoor air and the indoor air, wherein the heating-element accommodating-box cooling apparatus is mounted exteriorly on a panel of the heating-element accommodating box. Consequently, it is possible to effect cooling of the heating-element accommodating box with energy saving, and the space for installation of the cooling apparatus in the box is not required.

6 Claims, 16 Drawing Sheets

⬜ FLOW IN INDOOR AIR PASSAGE

⬛ FLOW IN OUTDOOR AIR PASSAGE

⇨ FLOW IN INDOOR AIR PASSAGE

⬛ FLOW IN OUTDOOR AIR PASSAGE

⇨ FLOW IN INDOOR AIR PASSAGE

➡ FLOW IN OUTDOOR AIR PASSAGE

FIG. 15
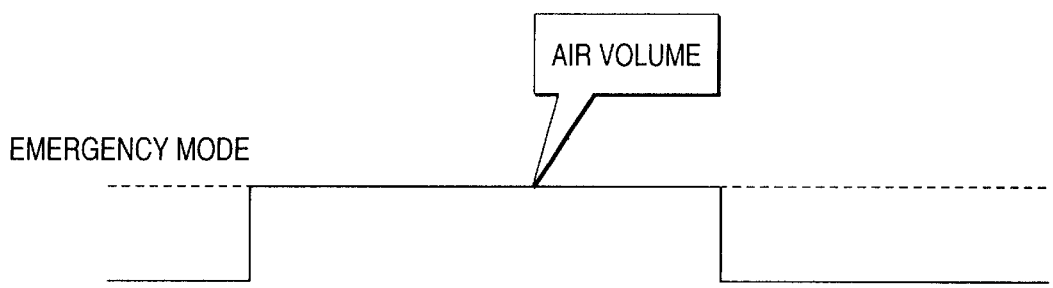
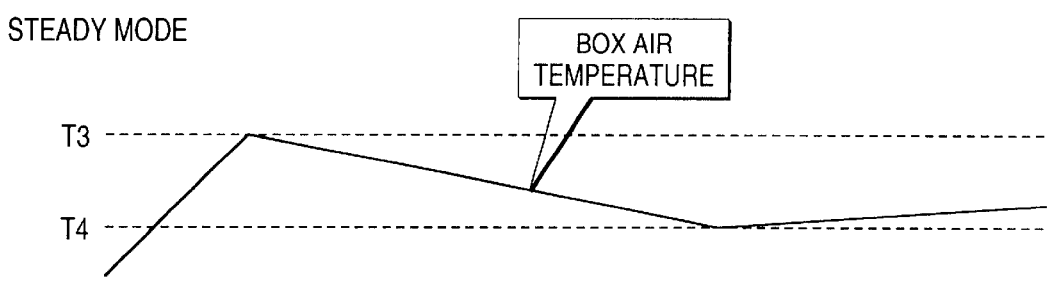
FIG. 16
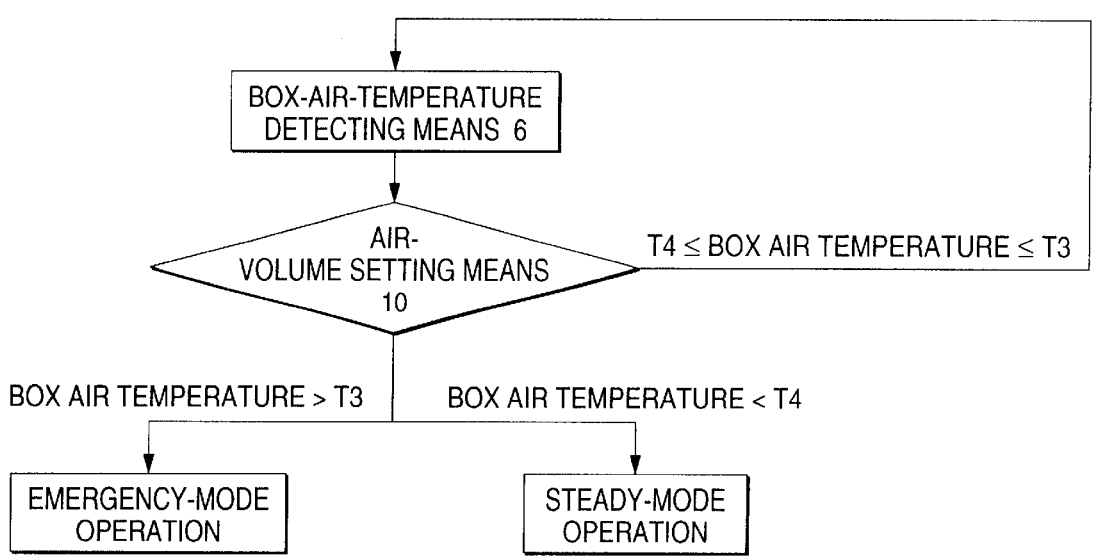

HEATING-ELEMENT ACCOMMODATING-BOX COOLING APPARATUS AND METHOD OF CONTROLLING THE SAME

BACKGROUND OF THE INVENTION

1. Field of the Invention

The present invention relates to a box-shaped structure which is installed outdoors and whose space for installing a cooling apparatus is limited, and which has therein a heating element whose heat generation rate is so large that cooling is required even during the winter season, the box-shaped structure being a box having such a precision control board that the temperature, humidity, dust, and the like affect the performance and life of electronic components. More particularly, the present invention relates to a cooling apparatus therefor and a method of controlling the same.

2. Description of the Related Art

In recent years, advances have been made in production of high-performance electronic components and densification of electronic components on control boards, and the amount of heat generated from the control board has increased remarkably. In consequence, the internal temperature of the box tends to rise, and the assurance of operation and product life of electronic components on the control board are largely affected by the internal temperature of the box. For this reason, it has become impossible to ensure reliability unless the internal temperature of the box is cooled to a fixed level or below.

In addition, due to the adoption of precision electronic components, it has also become an important factor to eliminate moisture and dust in the air inside the box.

Conventionally, to cool this type of box, a method is known in which an indoor unit is installed inside the box and is connected to an outdoor unit outside the box by means of a refrigerant pipe, and such as the one shown in FIG. 20 has been generally adopted.

Hereafter, a description will be given of that heating-element accommodating-box cooling apparatus with reference to FIG. 20.

As shown in the drawing, the following are installed in a box 101: a control board 102 which generates a thermal load; an indoor unit 103; a temperature sensor 104 for detecting the air temperature of the inside of the box 101 and for transmitting a signal to the indoor unit 103; and a power supply 105.

An outdoor unit 106 is installed outside the box 101, and is connected to the indoor unit 103 by means of a refrigerant pipe 107.

In the above-described configuration, if the control board 102 is operated, the internal temperature of the box 101 gradually rises due to its heat generation.

Accordingly, when the temperature detected by the temperature sensor 104 exceeds a set temperature, an operation signal is generated to cause the indoor unit 103 to start operation and, and the internal temperature of the box 101 drops. On the other hand, if the temperature detected by the temperature sensor 104 drops below the set temperature, a stop signal is generated to stop the indoor unit 103.

While repeating the above-described operation, the internal temperature of the box 101 is kept within a fixed range.

With such a conventional heating-element accommodating-box cooling apparatus, since its surrounding portions are sealed by a heat insulating material, heat is not radiated, so that even if the outdoor air temperature is low during such as the winter season, the cooling apparatus must be necessarily operated, so that a large amount of cooling energy is wasted.

SUMMARY OF THE INVENTION

An object of the invention is to overcome the above conventional problems, and by installing a cooling apparatus on the panel of the heating-element accommodating box, air inside the box is cooled as heat exchange is effected between outdoor air and air inside the box when the outdoor air temperature is low. Consequently, the operation time of an existing cooling apparatus can be reduced, so that energy saving can be realized. In addition, since the cooling apparatus is mounted exteriorly on the panel, the internal space of the heating-element accommodating box is not used, so that the execution of installation with respect to the existing heating-element accommodating box is easy.

Another object of the invention is to provide a heating-element accommodating-box cooling apparatus which is capable of realizing energy saving and has excellent executionability of installation as described above.

To achieve the above objects, according to the invention, there is provided a heating-element accommodating-box cooling apparatus comprising: an indoor air passage for fetching air in a heating-element accommodating box and returning the air in the heating-element accommodating box to an interior of the heating-element accommodating box to circulate the air in the heating-element accommodating box; an outdoor air passage for fetching outdoor air and exhausting the fetched outdoor air to the outside; a partition plate provided so that both of the air passages become independent of each other; a fan unit for conveying air in the outdoor air passage and the indoor air passage; and a heat exchange element disposed at a point of intersection between the outdoor air passage and the indoor air passage to exchange the sensible heat of the outdoor air and the indoor air, wherein the heating-element accommodating-box cooling apparatus is mounted exteriorly on a panel of the heating-element accommodating box.

According to the invention, when the outdoor air temperature is low, heat exchange is effected between the outdoor air and the air inside the heating-element accommodating box, thereby making it possible to lower the temperature of air inside the box.

Consequently, the operation time of the existing cooling apparatus can be reduced, with the result that it is possible to obtain a heating-element accommodating-box cooling apparatus which is capable of energy saving operation in comparison with a conventional arrangement.

In addition, since the outdoor air and the air inside the heating-element accommodating box do not become mixed, it is possible to avoid the entrance of moisture and dust into the box, so that adverse effects of vapor condensation and dust on the equipment inside the heating-element accommodating box do not occur.

Further, since the heating-element accommodating-box cooling apparatus is mounted exteriorly on the panel of the heating-element accommodating box, the heating-element accommodating-box cooling apparatus can be easily mounted on a heating-element accommodating box which has no extra space.

In addition, as another means, there is provided a heating-element accommodating-box cooling apparatus comprising: a casing having an indoor air inlet and an indoor air outlet which communicate with a heating-element accommodating box as well as an outdoor air inlet and an outdoor air outlet which communicate with outdoor air; and a fan and a heat exchange element provided in the casing, a rotating shaft of the fan unit being arranged in such a manner as to be parallel to a longitudinal direction of the heat exchange element and perpendicular to a blowing-out direction of the indoor air.

According to the invention, by virtue of the above-described means, the casing of the heating-element accommodating-box cooling apparatus can be made thin and compact, and the execution of installation is facilitated.

Also, to achieve the above objects, according to the invention, there is provided a method of controlling a heating-element accommodating-box cooling apparatus including a box air temperature sensor for measuring the temperature of the interior of a heating-element accommodating box, an outdoor air temperature sensor for measuring the temperature of the outdoor air, a fan unit for blowing cool air into the box, an air heat exchange-type air conditioner for cooling the heating-element accommodating box by using air-to-air heat exchange between the air in the box and the outdoor air, and a refrigerant-type air conditioner for the heating-element accommodating box by using a refrigerant, comprising the steps of: operating the air heat exchange-type air conditioner when a temperature difference obtained by subtracting the outdoor air temperature from the box air temperature is greater than a preset temperature difference T1; and operating the refrigerant-type air conditioner when the box air temperature is higher than a preset temperature T2, so as to reduce energy required for cooling the heating-element accommodating box.

According to the invention, by using the above-described means, the air heat exchange-type air conditioner is operated to effect heat exchange between the outdoor air and the air inside the heating-element accommodating box. This lowers the temperature of the air inside the heating-element accommodating box, so that the cooling load is lowered, ad the operating time of the refrigerant-type air conditioner can be reduced. Hence, it becomes possible to reduce the amount of consumption of the energy required for cooling as compared with the conventional cooling operation.

BRIEF DESCRIPTION OF THE DRAWINGS

FIG. 15 is a diagram illustrating a pattern for controlling the heating-element accommodating-box cooling apparatus in accordance with a thirteenth embodiment of the invention;

FIG. 16 is a flowchart illustrating a method of controlling the heating-element accommodating-box cooling apparatus in accordance with the thirteenth embodiment of the invention;

DETAILED DESCRIPTION OF THE PREFERRED EMBODIMENTS

Figure 1:
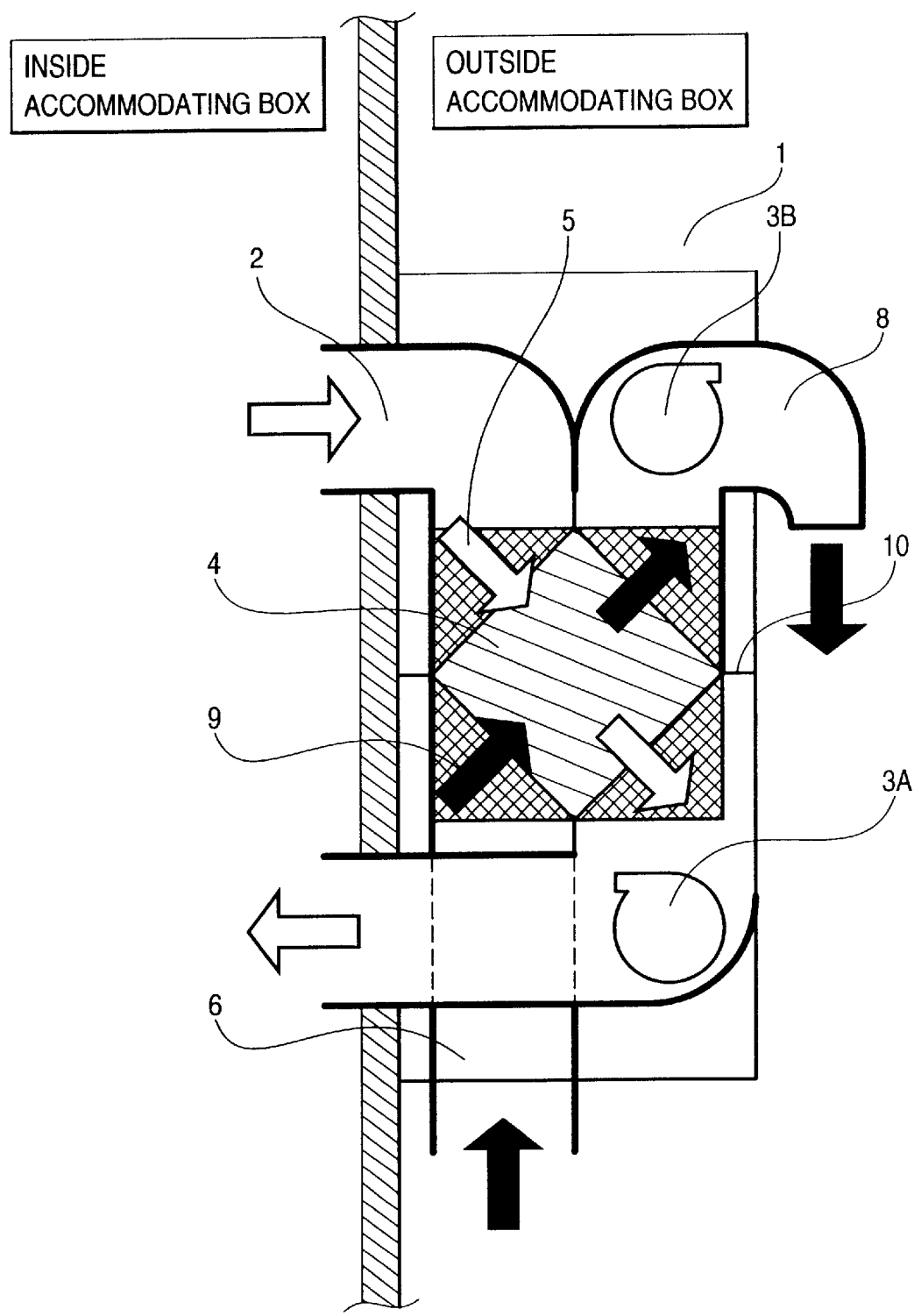
FIG. 1 is a schematic cross-sectional view illustrating the structure of a heating-element accommodating-box cooling apparatus in accordance with a first embodiment of the invention.

In a first aspect of the invention, the heating-element accommodating-box cooling apparatus comprises: an indoor air passage for fetching air in a heating-element accommodating box and returning the air in the heating-element accommodating box to an interior of the heating-element accommodating box to circulate the air in the heating-element accommodating box; an outdoor air passage for fetching outdoor air and exhausting the fetched outdoor air to the outside; a partition plate provided so that both of the air passages become independent of each other; a fan unit for conveying air in the outdoor air passage and the indoor air passage; and a heat exchange element disposed at a point of intersection between the outdoor air passage and the indoor air passage to exchange the sensible heat of the outdoor air and the indoor air, wherein the heating-element accommodating-box cooling apparatus is mounted exteriorly on a panel of the heating-element accommodating box. In operation, since the operation time of an existing cooling apparatus can be reduced without mixing of dust into the heating-element accommodating box, energy saving operation can be effected. In addition, since the heating-element accommodating-box cooling apparatus is mounted exteriorly on the panel of the heating-element accommodating box, the heating-element accommodating-box cooling apparatus can be easily mounted on a heating-element accommodating box which has no extra space.

In a second aspect of invention, the heating-element accommodating-box cooling apparatus comprises: a casing having an indoor air inlet and an indoor air outlet which communicate with a heating-element accommodating box as well as an outdoor air inlet and an outdoor air outlet which communicate with outdoor air; and a fan and a heat exchange element provided in the casing, a rotating shaft of the fan unit being arranged in such a manner as to be parallel to a longitudinal direction of the heat exchange element and perpendicular to a blowing-out direction of the indoor air. In operation, by virtue of the form of this arrangement, the casing of the heating-element accommodating-box cooling apparatus can be made thin and compact, so that the execution at the time of installation of the cooling apparatus can be facilitated.

In a third aspect of the invention, the heating-element accommodating-box cooling apparatus further comprises an air cooler for cooling the heating-element accommodating box in an auxiliary manner when the outdoor air temperature is high. In operation, it is possible to cope with an increase in the amount of cooling required when the outdoor air temperature is high, while energy saving operation is performed when the outdoor air temperature is low.

In a fourth aspect of the invention, the indoor air inlet and the indoor air outlet are formed as circular holes in terms of their shapes, and are disposed in the casing of the heating-element accommodating-box cooling apparatus. In operation, processing for forming openings in the panel of the box is facilitated at the time of installation of the heating-element accommodating-box cooling apparatus.

In a fifth aspect of the invention, the indoor air inlet and the indoor air outlet are respectively provided with flanges Hence, in operation, airtightness can be ensured with easy execution of installation even if the panel of the heating-element accommodating box is thick.

In a sixth aspect of the invention, heat exchange plates of the heat exchange element are made impermeable to moisture. Hence, in operation, the moisture contained in the outdoor air does not become mixed into the interior of the heating-element accommodating box, so that adverse effects of moisture due to vapor condensation and the like on the equipment inside the heating-element accommodating box do not occur.

In a seventh aspect of the invention, control is provided such that when the outdoor air temperature is low, the operation of the air cooler is stopped and heat exchange is effect, whereas when the outdoor air temperature is high, heat exchange is not effected, but the air cooler is operated. Accordingly, in operation, energy saving is possible since excess consumption of energy due to heat exchange and unnecessary operation of a refrigerating machine are not performed.

In an eighth aspect of the invention, an air inlet or an air outlet communicating with the interior of the heating-element accommodating box is used for wiring so as to make it unnecessary to newly provide a separate opening for the wiring. Hence, in operation, it is possible to reduce the number of steps in the execution of installation.

A ninth aspect of the invention is characterized in that the heating-element accommodating-box cooling apparatus is installed such that a part or the whole of its main body is embedded in a panel (outer wall) of the heating-element accommodating box and in an openable door. Hence, in operation, it is possible to make small the projecting portion of the heating-element accommodating-box cooling apparatus on the outer peripheral surface of the heating-element accommodating box.

In a tenth aspect of the invention, there is provided a heating-element accommodating-box cooling apparatus comprising: an indoor air passage for fetching air in a heating-element accommodating box and returning the air in the heating-element accommodating box to an interior of the heating-element accommodating box to circulate the air in the heating-element accommodating box; an outdoor air passage for fetching outdoor air and exhausting the fetched outdoor air to the outside; a partition plate provided so that both of the air passages become independent of each other; a fan unit for conveying air in the outdoor air passage and the indoor air passage; and a heat exchange element disposed at a point of intersection between the outdoor air passage and the indoor air passage to exchange the sensible heat of the outdoor air and the indoor air, wherein the heating-element accommodating-box cooling apparatus is mounted on a ceiling of the heating-element accommodating box. Accordingly, in operation, the heating-element accommodating-box cooling apparatus can be installed even in a case where there is no installation space around outer peripheral side portions of the heating-element accommodating box.

In an eleventh aspect of the invention, the method of controlling a heating-element accommodating-box cooling apparatus including a box air temperature sensor for measuring the temperature of the interior of a heating-element accommodating box, an outdoor air temperature sensor for measuring the temperature of the outdoor air, a fan unit for blowing cool air into the box, an air heat exchange-type air conditioner for cooling the heating-element accommodating box by using air-to-air heat exchange between the air in the box and the outdoor air, and a refrigerant-type air conditioner for the heating-element accommodating box by using a refrigerant, comprises the steps of: operating the air heat exchange-type air conditioner when a temperature difference obtained by subtracting the outdoor air temperature from the box air temperature is greater than a preset temperature difference T1; and operating the refrigerant-type air conditioner when the box air temperature is higher than a preset temperature T2, so as to reduce energy required for cooling the heating-element accommodating box. In operation, by operating the air heat exchange-type air conditioner whose amount of consumption of the energy required for cooling is small as compared with the refrigerant-type air conditioner, the operating time of the refrigerant-type air conditioner is reduced, so that energy saving can be realized.

In a twelfth aspect of the invention, in the method of controlling a heating-element accommodating-box cooling apparatus according to the eleventh aspect, step-operation commanding means changes the number of heating-element accommodating-box cooling apparatuses to be operated in accordance with the cooling load inside the box obtained by box-air-temperature detecting means and outdoor-air-temperature detecting means. In operation, by operating a minimum number of heating-element accommodating-box cooling apparatuses required for the cooling load, it is possible to suppress the consumption of excessive energy.

In a thirteenth aspect of the invention, in the method of controlling a heating-element accommodating-box cooling apparatus according to the eleventh aspect, in the event that the box air temperature has become higher than a preset box-air upper limit temperature, and there has arisen a risk of causing damage to equipment inside the box, emergency-mode operation is effected by promptly increasing the number of revolution of the fan unit of the heating-element accommodating-box cooling apparatus to increase the air volume, thereby increasing the cooling capacity and lowering the internal temperature of the heating-element accommodating box to a safety temperature region. In operation, it is possible to avoid causing damage to the equipment inside the heating-element accommodating box due to the high temperature.

In a fourteenth aspect of the invention, there is provided a heating-element accommodating-box cooling apparatus according to the eleventh aspect, wherein the heating-element accommodating-box cooling apparatus has abnormality alarming means for notifying that the heating-element accommodating-box cooling apparatus has effected the emergency-mode operation. In operation, it is possible to cope with an emergency.

In a fifteenth aspect of the invention, in the heating-element accommodating-box cooling apparatus according to the eleventh aspect, solar cells are mounted on the heating-element accommodating box, and the generated electric power is utilized for operating the heating-element accommodating-box cooling apparatus. In operation, part of the amount of consumption of energy required by the heating-element accommodating-box cooling apparatus for cooling can be borne, so that energy saving can be realized.

In a sixteenth aspect of the invention, in the heating-element accommodating-box cooling apparatus according to the eleventh aspect, electronic cooling means for cooling the heating-element accommodating box by the Peltier effect is provided. In operation, since the heating-element accommodating box is cooled, it is possible to alleviate the load for cooling the heating-element accommodating box.

Referring now to the accompanying drawings, a description will be given of the embodiments of the invention.
(First Embodiment)

FIG. 1 shows a first embodiment which can be said to constitute a basic configuration of a heating-element accommodating-box cooling apparatus in accordance with the invention of this application.

A housing 1 of the heating-element accommodating-box cooling apparatus is configured as a so-called exteriorly mounted type in which the housing 1 is mounted on an outer panel of the heating-element accommodating box.

Hereafter, a description will be given of its internal configuration.

A circulating indoor air passage 5 is formed in which the air inside the heating-element accommodating box (hereafter, this air will be referred to as the indoor air) is fetched from an indoor air inlet 2 by an indoor air-side fan 3A of a fan unit 3, then passes through a heat exchange element 4, and returns to the interior of the heating-element accommodating box.

Meanwhile, an outdoor air passage 9 is formed in which outside air is fetched through an outdoor air inlet 6 and is discharged to the atmosphere through the heat exchange element 4, an outdoor air-side fan 3B of the fan unit 3, and an outdoor air outlet 8.

A partition plate 10 is provided for partitioning the respective air passages in a substantially airtight state so that these two air passages will be independent, and the heat exchange element 4 for exchanging the sensible heat of the outdoor air and the indoor air is disposed at a point of intersection of the outdoor air passage 9 and the indoor air passage 5.

Through the above-described configuration, the heating-element accommodating-box cooling apparatus fetches outdoor air when the outdoor ar temperature is low, effects heat exchange with the warm air inside the heating-element accommodating box by means of the heat exchange element 4, exhausts warmed outdoor air, and supplies cooled air to the interior of the box.

As a result, the internal temperature of the box can be lowered by minimizing the operation of an existing cooling apparatus, so that energy saving is made possible.

In addition, since the outdoor air passage 9 and the indoor air passage 5 are made independent of each other by the partition plate 10, the air inside the heating-element accommodating box does not become mixed with the outdoor air, so that dust contained in the outdoor air is prevented from entering the interior of the heating-element accommodating box, and adverse effects of the dust on equipment inside the heating-element accommodating box do not occur.
(Second Embodiment)

Figure 2:
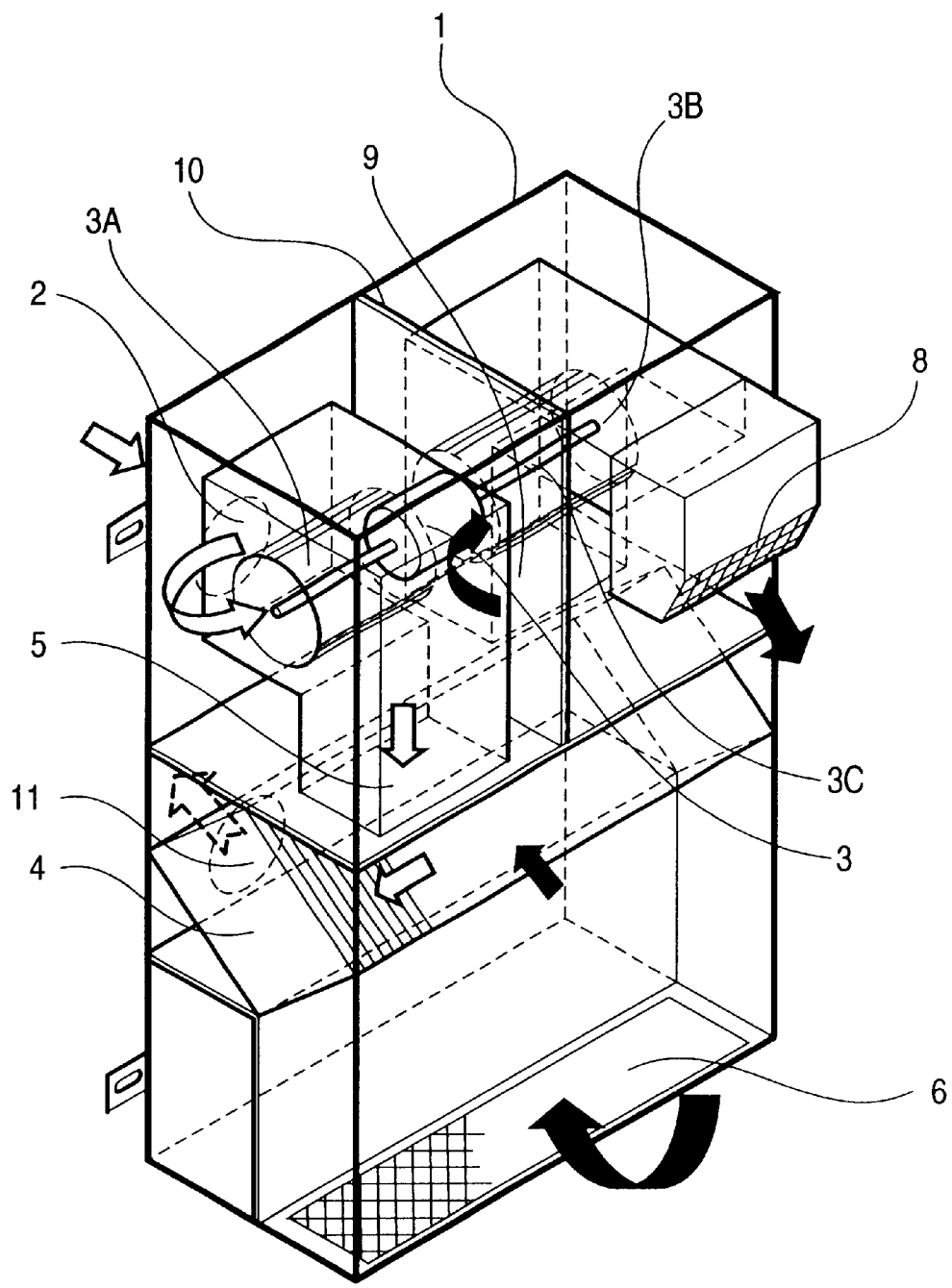
FIG. 2 is a perspective structural diagram illustrating a heating-element accommodating-box cooling apparatus in accordance with a second embodiment of the invention.

FIG. 2 shows a second embodiment of the heating-element accommodating-box cooling apparatus in accordance with the invention of this application.

The indoor air inlet 2 and an indoor air outlet 11 which communicate with the heating-element accommodating box are provided on one wall surface of the housing 1 forming the heating-element accommodating-box cooling apparatus, while the outdoor air inlet 6 and the outdoor air outlet 8 which communicate with the outdoor air are respectively provided on other surfaces thereof. The fan unit 3 and the heat exchange element 4 are arranged inside the housing 1 such that a rotating shaft 3C of the fan unit 3 is parallel to the longitudinal direction (in the layered direction) of the heat exchange element 4 and perpendicular to the blowing direction of the indoor air.

In the above-described arrangement, cold outdoor air can be sucked from the outdoor air inlet 6 located in a lower portion of the heating-element accommodating-box cooling apparatus, and can be blown out from the outdoor air outlet 8 located in an upper portion of the apparatus through the heat exchange element 4 and the outdoor air-side fan 3B of the fan unit 3. At the same time, heated air from the heating-element accommodating box can be sucked from the indoor air inlet 2 located in an upper portion of the apparatus, and can be blown out from the indoor air outlet 11 located in a lower portion of the apparatus through the heat exchange element 4 and the indoor air-side fan 3A of the fan unit 3 while effecting heat exchange between the indoor air and the outdoor air.

In addition, the fan unit 3 and the heat exchange element 4 can be arranged in the center of the housing 1 of the heating-element accommodating-box cooling apparatus in a state in which the longitudinal directions of the rotating shaft 3C of the fan unit 3 and the heat exchange element 4 are set in the horizontal direction. Consequently, heat exchange can be effected with high space efficiency, and the housing 1 of the heating-element accommodating-box cooling apparatus can be made thin, so that the execution at the time of installation of the cooling apparatus can be facilitated.
(Third Embodiment)

Figure 3:
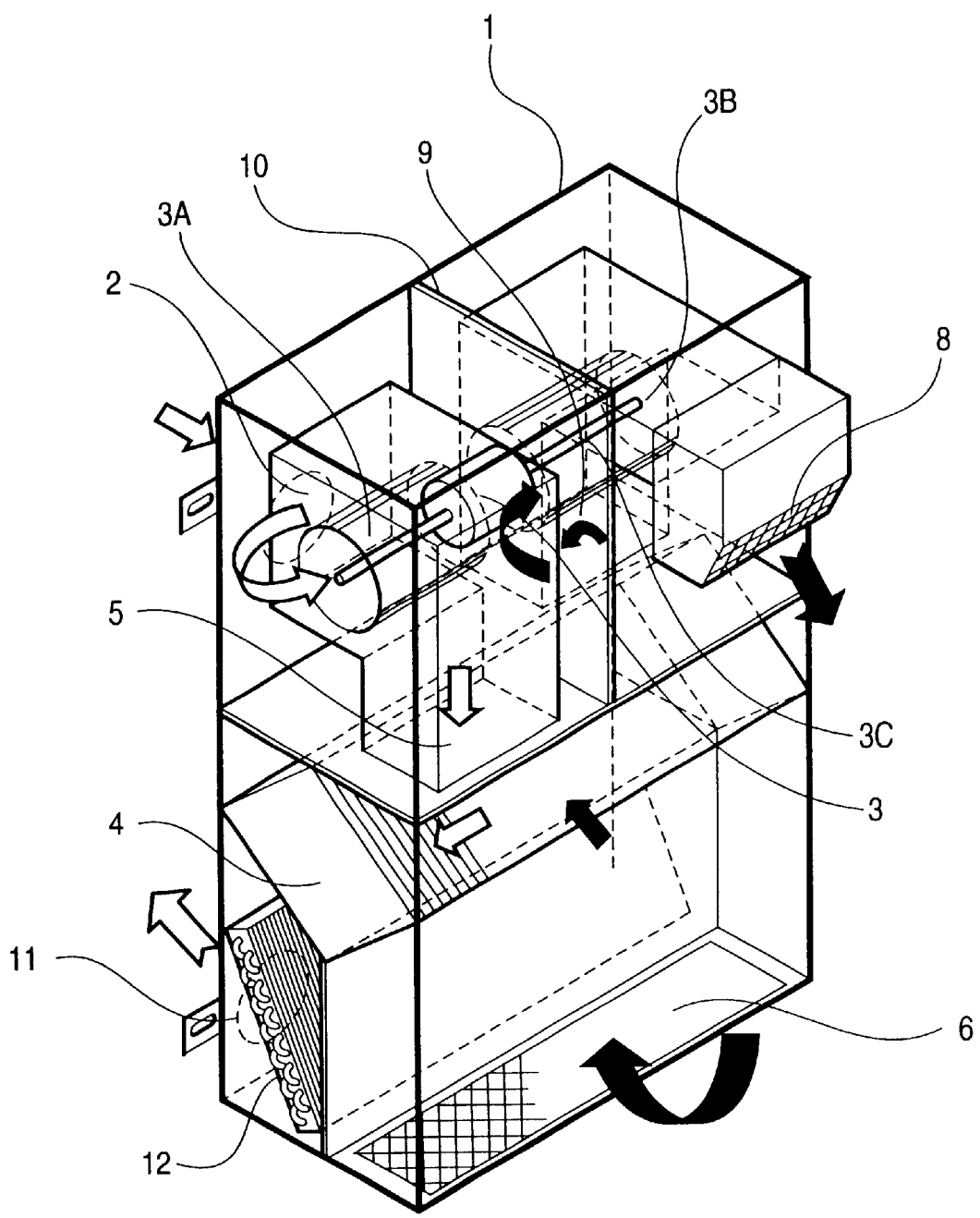
FIG. 3 is a perspective structural diagram illustrating a heating-element accommodating-box cooling apparatus in accordance with a third embodiment of the invention.

FIG. 3 shows a third embodiment of the heating-element accommodating-box cooling apparatus in accordance with the invention of this application.

In this embodiment, an air cooler 12 for effecting auxiliary cooling of the heating-element accommodating box when the outdoor air temperature is high is added to the above-described second embodiment.

When the outside air temperature is high during such as the summer season, the operation is stopped while limiting heat exchange by the heat exchange element 4, whereas the air cooler 12 is operated to cool the heating-element accommodating box in an auxiliary manner.

As a result, it is possible to cope with an increase in the amount of cooling required when the outdoor air temperature is high, while effecting energy saving operation performed when the outdoor air temperature is low.

It should be noted that although the term "auxiliary cooling" is used in the description of this embodiment, the air cooler 12 may be used not for auxiliary cooling but for primary cooling during an intermediate season or the like, and it goes without saying that the air cooler 12 can be used for primary cooling when the amount of heat generated in the heating-element accommodating box is not very high.

(Fourth Embodiment)

Figure 4:
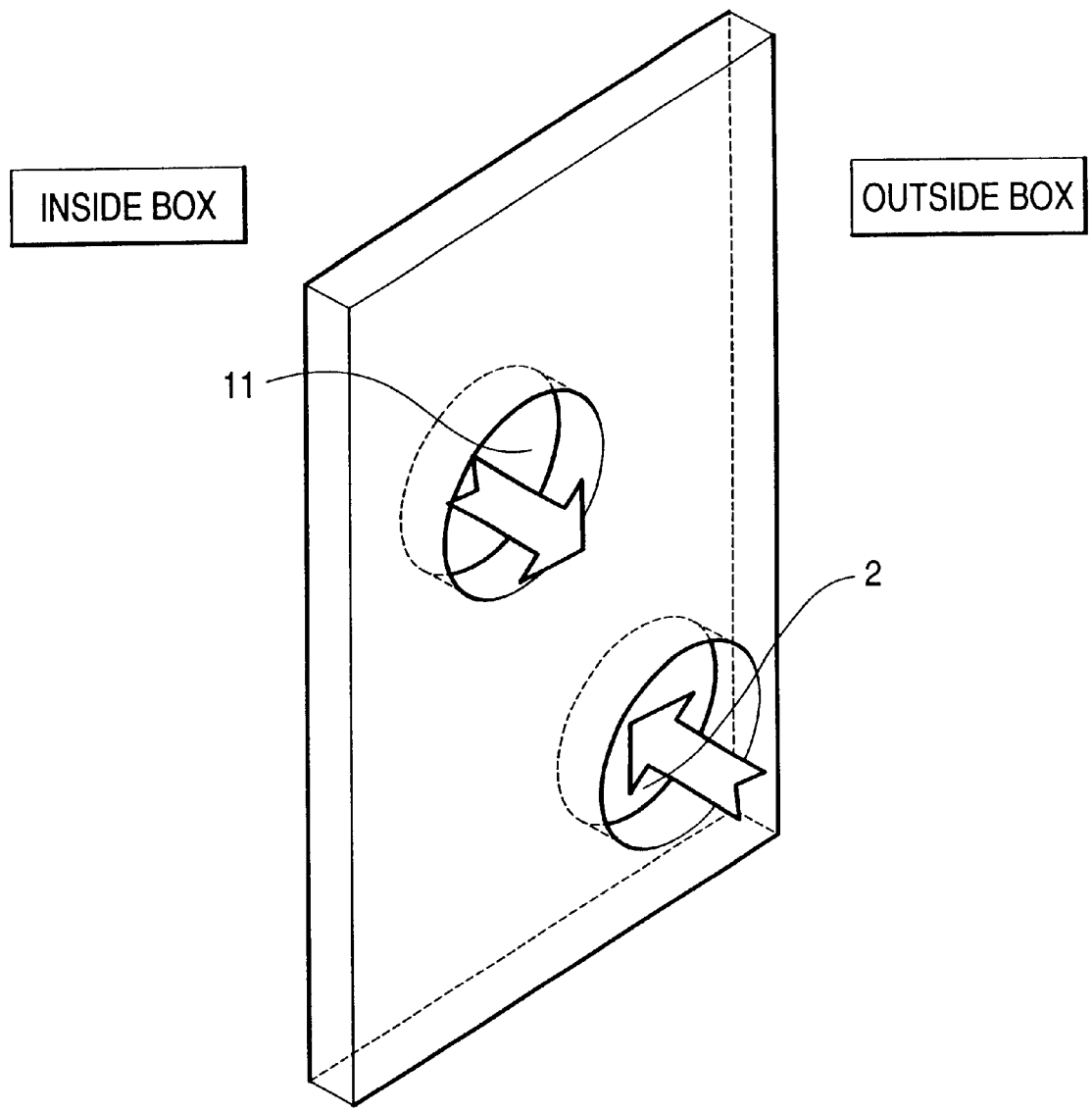
FIG. 4 is a perspective structural diagram illustrating a heating-element accommodating-box cooling apparatus in accordance with a fourth embodiment of the invention.

FIG. 4 shows a fourth embodiment of the heating-element accommodating-box cooling apparatus in accordance with the invention of this application.

In this embodiment, the indoor air inlet 2 and the indoor air outlet 11 are formed as round holes in terms of their shapes, and are disposed in the housing 1 of the heating-element accommodating-box cooling apparatus.

Generally, there are many cases where the outer casing of the heating-element accommodating box adopts an aluminum honeycomb structure or a heat-insulating material sandwich structure using aluminum, and there are many cases where processing is possible using a relatively easy tool.

In this embodiment, in addition to the arrangement of each of the above-described embodiments, since the holes of the indoor air inlet 2 and the indoor air outlet 11 are formed in circular shapes, processing for forming openings in the panel of the box is extremely facilitated at the time of installation of the heating-element accommodating-box cooling apparatus.

(Fifth Embodiment)

Figure 5:
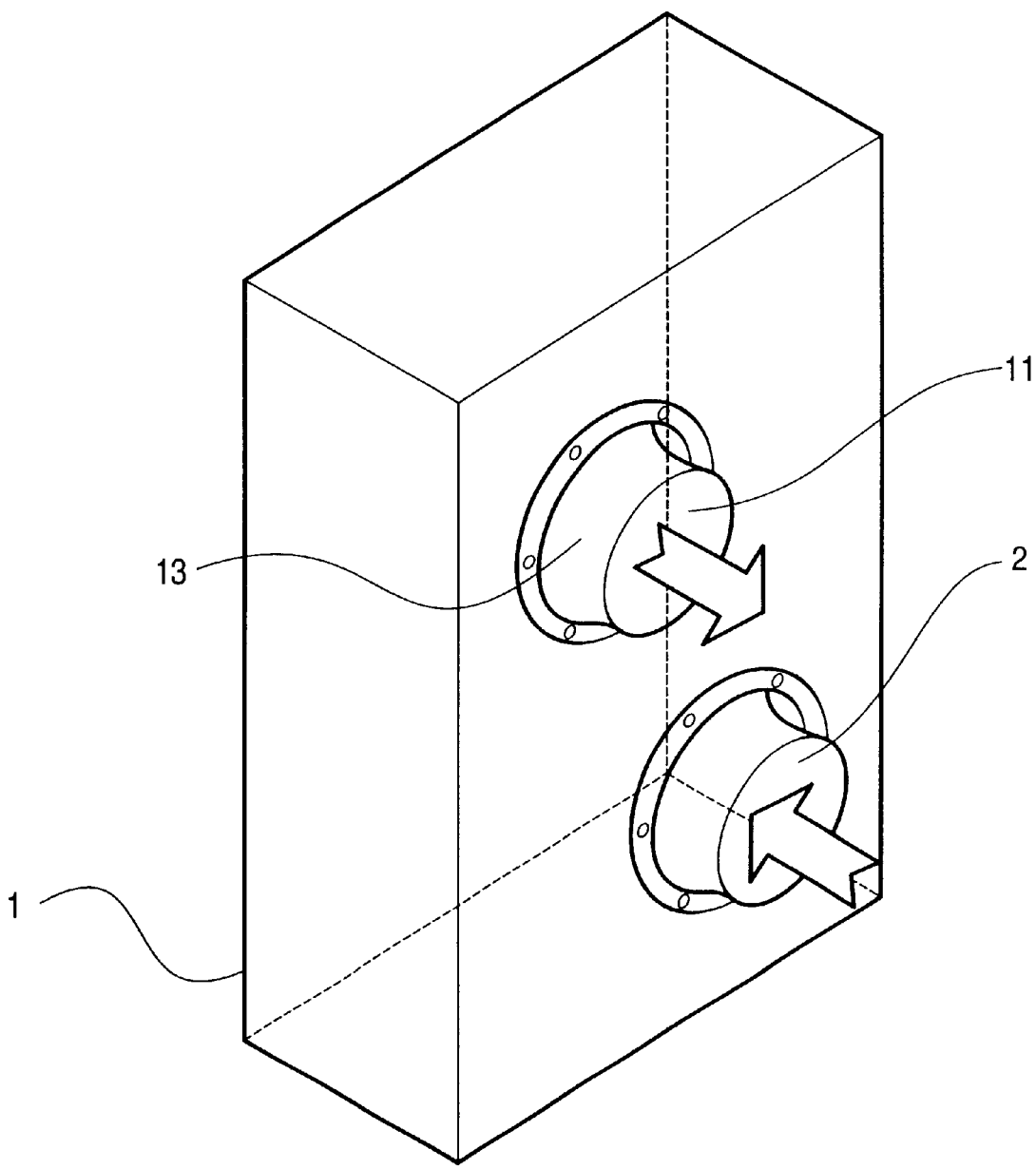
FIG. 5 is a perspective structural diagram illustrating a heating-element accommodating-box cooling apparatus in accordance with a fifth embodiment of the invention.

FIG. 5 shows a fifth embodiment of the heating-element accommodating-box cooling apparatus in accordance with the invention of this application.

In this embodiment, in addition to the arrangement of the above-described fourth embodiment, the indoor air inlet 2 and the indoor air outlet 11 are respectively provided with flanges 13.

As a result, airtightness can be ensured with easy execution of installation even if the outer panel for forming the heating-element accommodating box is thick.

(Sixth Embodiment)

In this embodiment, heat exchange plates of the heat exchange element 4 are made impermeable to moisture (not shown).

As a result, the moisture contained in the outdoor air does not become mixed into the interior of the heating-element accommodating box, so that adverse effects of moisture due to vapor condensation and the like on the equipment inside the heating-element accommodating box do not occur.

(Seventh Embodiment)

Figure 6:
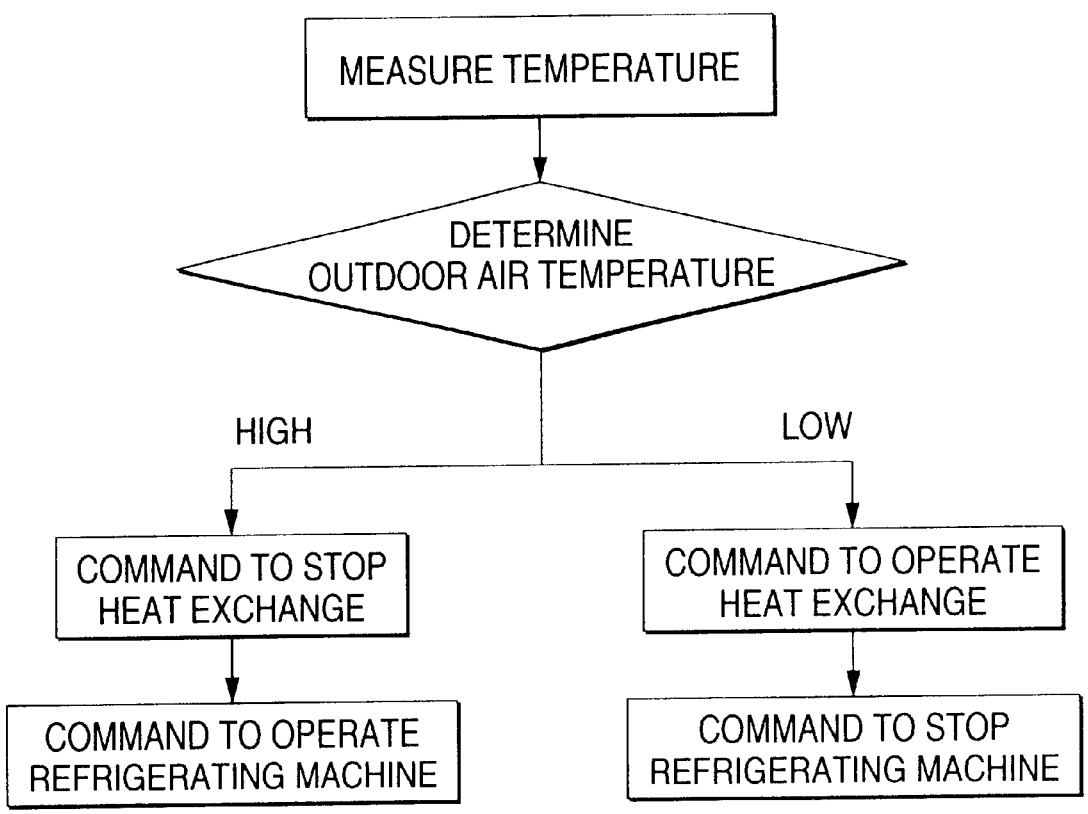
FIG. 6 is a perspective structural diagram illustrating a heating-element accommodating-box cooling apparatus in accordance with a seventh embodiment of the invention.

FIG. 6 shows a seventh embodiment of the heating-element accommodating-box cooling apparatus in accordance with the invention of this application.

By measuring the outdoor air temperature, the operation of the air cooler 12 is stopped and heat exchange is effected when the outdoor air temperature is low.

Meanwhile, when the outdoor air temperature is high, the air cooler 12 is operated without effecting heat exchange.

By performing the above-described control, it is so designed as not to effect excessive consumption of energy by heat exchange and unnecessary operation of the air cooler 12, thereby making it possible to realize energy saving.

(Eighth Embodiment)

Figure 7:
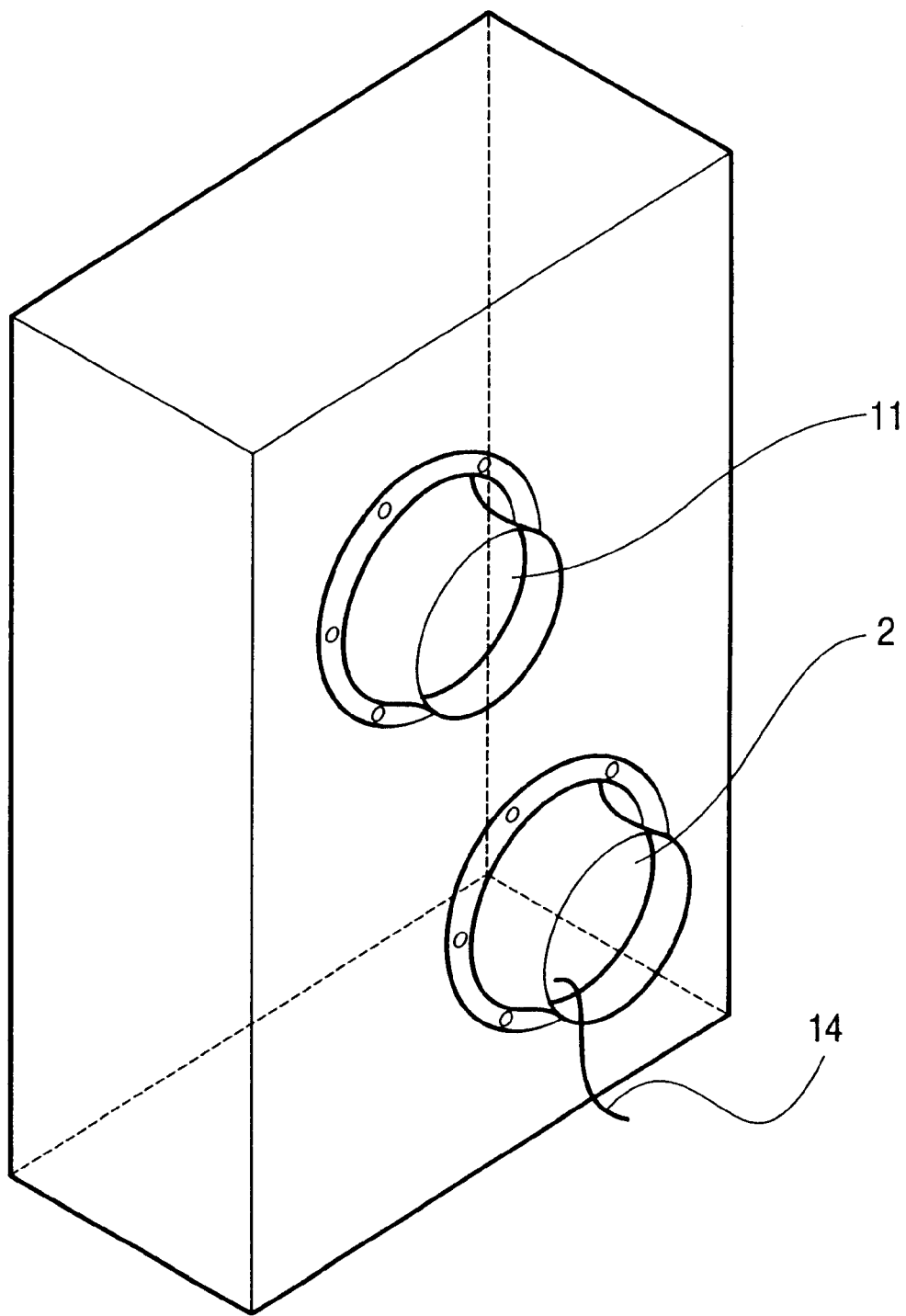
FIG. 7 is a perspective structural diagram illustrating a heating-element accommodating-box cooling apparatus in accordance with an eighth embodiment of the invention.

FIG. 7 shows an eighth embodiment of the heating-element accommodating-box cooling apparatus in accordance with the invention of this application.

The wiring 14, such as a power supply line and a communication line, is connected from the heating-element accommodating-box cooling apparatus to the interior of the heating-element accommodating box through the indoor air inlet 11 or the indoor air outlet 2, thereby making it unnecessary to separately provide an opening for the wiring.

Consequently, it is possible to reduce the number of steps in the execution of installation of the heating-element accommodating-box cooling apparatus on the heating-element accommodating box.

(Ninth Embodiment)

Figure 8:
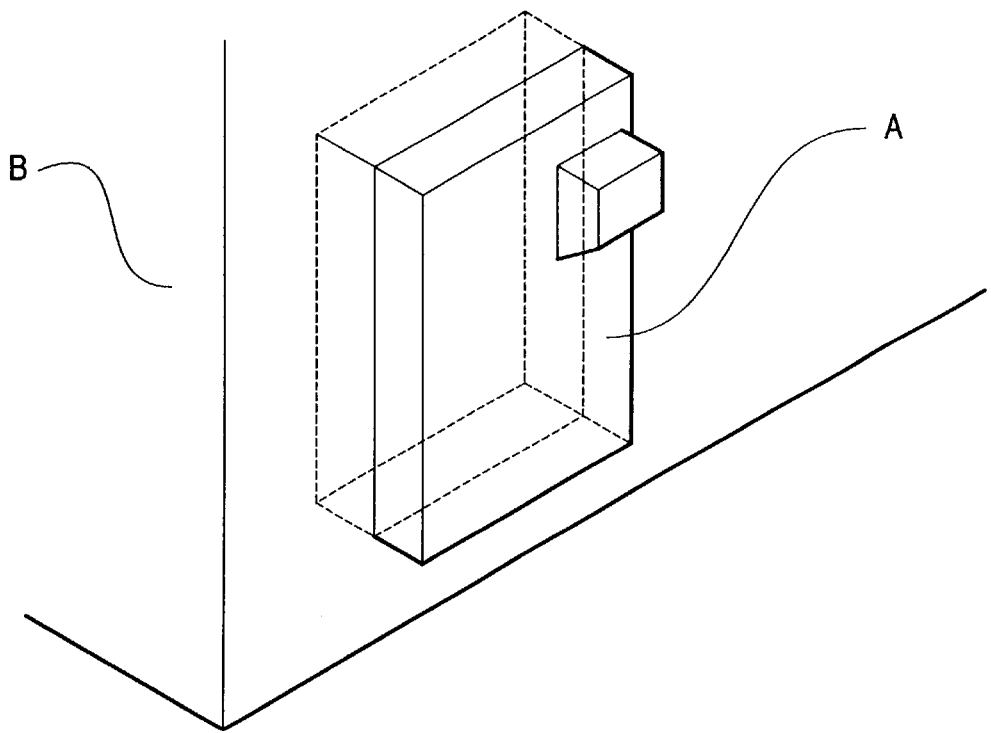
FIG. 8 is a perspective structural diagram illustrating a heating-element accommodating-box cooling apparatus in accordance with a ninth embodiment of the invention.

FIG. 8 shows a ninth embodiment of the heating-element accommodating-box cooling apparatus in accordance with the invention of this application.

An heating-element accommodating-box cooling apparatus A is installed such that a part or the whole of its main body is embedded in the panel (outer wall) of a heating-element accommodating box B, thereby making it possible to make the projecting portion small.

(Tenth Embodiment)

Figure 9:
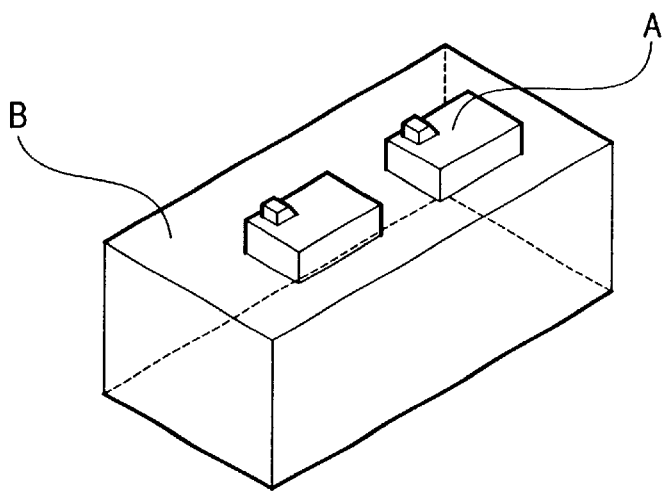
FIG. 9 is a perspective structural diagram illustrating a heating-element accommodating-box cooling apparatus in accordance with a tenth embodiment of the invention.

FIG. 9 shows a 10th embodiment of the heating-element accommodating-box cooling apparatus in accordance with the invention of this application.

The heating-element accommodating-box cooling apparatus A is installed on a ceiling of the heating-element accommodating box B, thereby making it possible to cope with a case where a sufficient installation space is not provided around outer peripheral side portions of the heating-element accommodating box B.

(Eleventh Embodiment)

Figure 10:
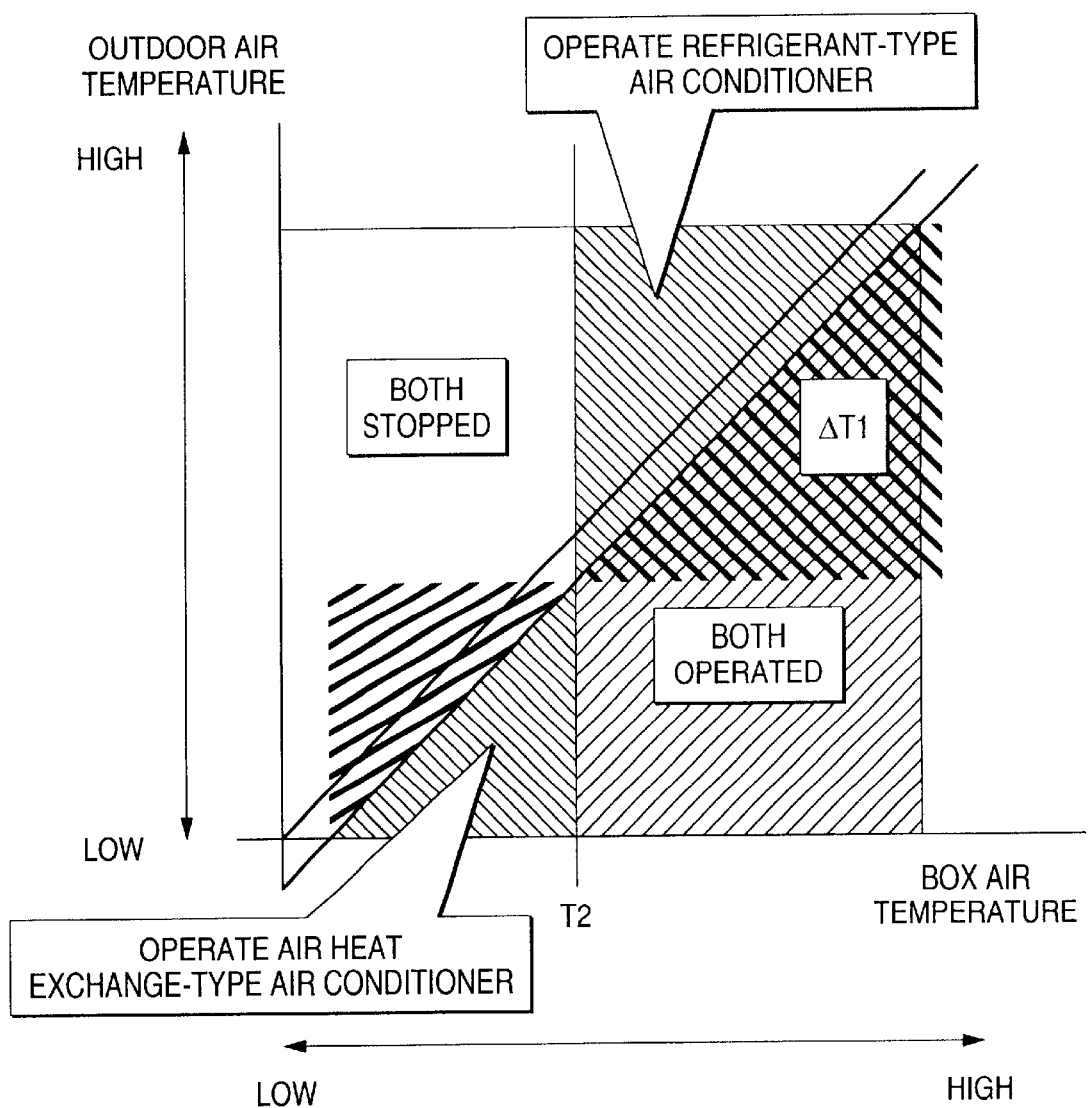
FIG. 10 is a diagram illustrating a pattern for controlling a heating-element accommodating-box cooling apparatus in accordance with an eleventh embodiment of the invention.
Figure 11:
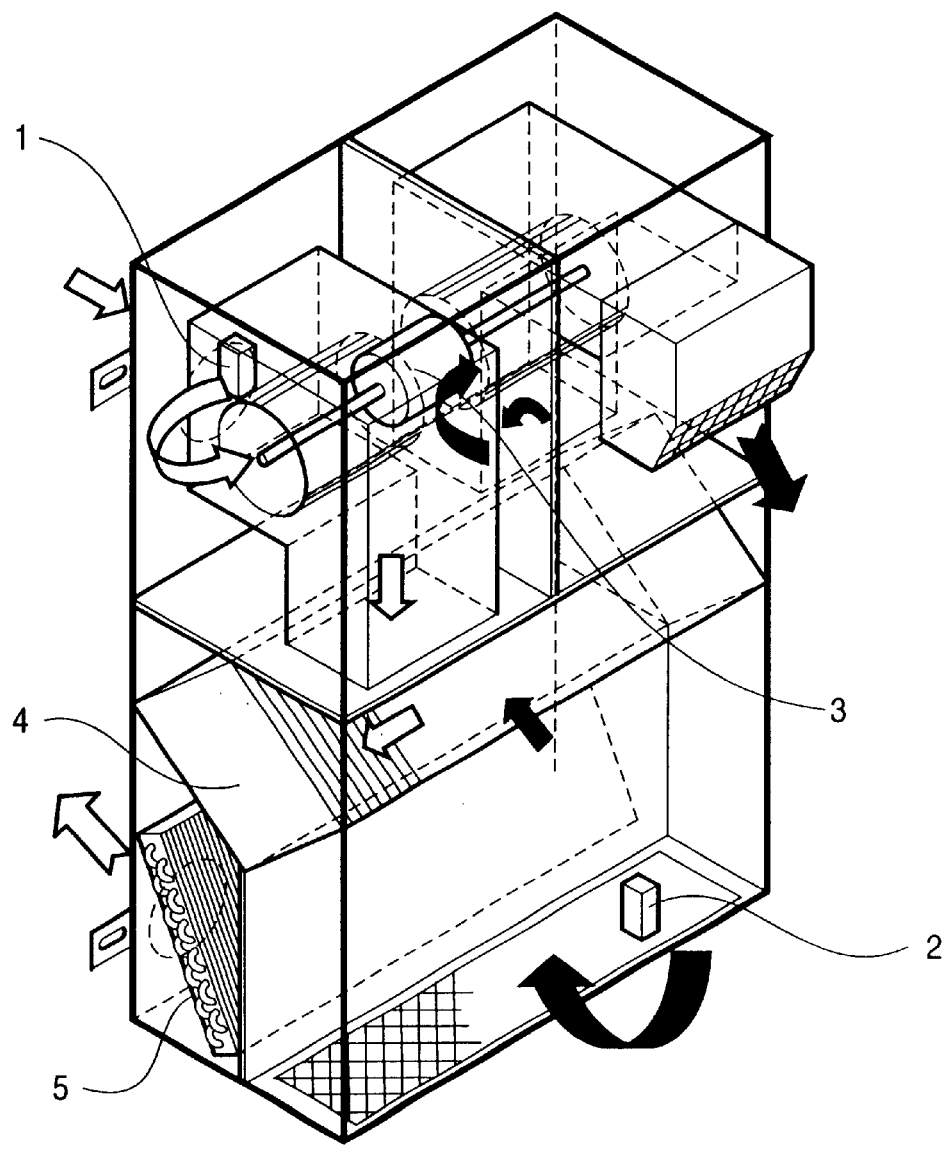
FIG. 11 is a diagram illustrating the heating-element accommodating-box cooling apparatus in accordance with the eleventh embodiment of the invention.
Figure 12:
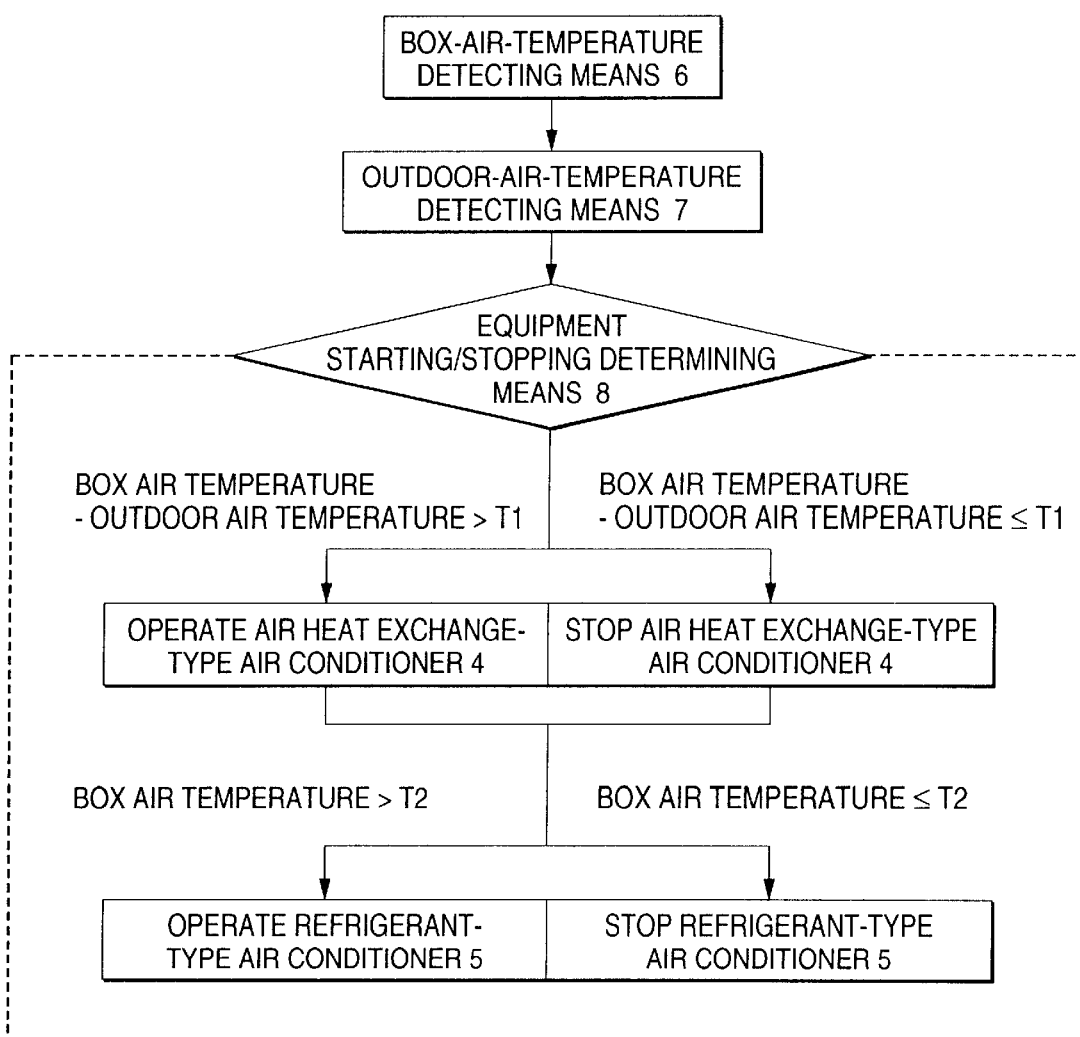
FIG. 12 is a flowchart illustrating a method of controlling the heating-element accommodating-box cooling apparatus in accordance with the first embodiment of the invention.

FIG. 10 is a diagram on the correlation between the temperature and the operation of air conditioners; FIG. 11 is a schematic diagram; and FIG. 12 shows control flow.

In these drawings, a box air temperature sensor 1 measures the temperature of the air in a heating-element accommodating box, an outdoor air temperature sensor 2 measures the temperature of the outdoor air, and a fan unit 3 increases or decreases the air volume depending on the temperature of the air inside the box.

An air heat exchange-type air conditioner 4 cools the heating-element accommodating box by effecting air-to-air heat exchange between the air in the heating-element accommodating box and the outdoor air. A refrigerant-type air conditioner 5 cools the heating-element accommodating box by using a refrigerant. As compared with the refrigerant-type air conditioner 5, the air heat exchange-type air conditioner 4 has an advantage in that the amount of consumption of energy required for cooling is small since there is no need to compress the refrigerant.

By selectively using the air heat exchange-type air conditioner 4 and the refrigerant-type air conditioner 5 depending on the in-box air temperature and the outdoor air temperature, it is possible to cool the heating-element accommodating box by reducing the amount of consumption of energy required for cooling as compared with the conventional cooling operation using only the refrigerant-type air conditioner.

It should be noted there are no differences in operation and advantages even if an air conditioner for cooling by means of a liquid is used instead of the refrigerant-type air conditioner 5.

A box-air-temperature detecting means 6 notifies an equipment starting/stopping determining means 8 of the box air temperature measured by the box air temperature sensor 1, while an outdoor-air-temperature detecting means 7 notifies the equipment starting/stopping determining means 8 of the outdoor air temperature measured by the outdoor air temperature sensor 2. When the outdoor air temperature is relatively low and a temperature difference obtained by subtracting the outdoor air temperature from the box air temperature is greater than a preset temperature difference T1, and the box air temperature is lower than or equal to a preset temperature T2, the equipment starting/stopping determining means 8 operates the air heat exchange-type air conditioner 4 and stops the refrigerant-type air conditioner 5.

When the outdoor air temperature is relatively high and the temperature difference is less than or equal to the preset temperature difference T1, and the box air temperature is higher than the preset temperature T2, the equipment starting/stopping determining means 8 stops the air heat exchange-type air conditioner 4 and operates the refrigerant-type air conditioner 5.

In addition, when the outdoor air temperature is relatively low and the temperature difference is greater than the preset temperature difference T1, and the box air temperature is higher than the preset temperature T2, the equipment starting/stopping determining means 8 operates both the air heat exchange-type air conditioner 4 and the refrigerant-type air conditioner 5.

In a low-temperature region where the cooling load is small, the refrigerant-type air conditioner 5 whose amount of consumption of operating energy is large can be stopped, whereas in a high-temperature region where the cooling load is large, since the outdoor air temperature becomes high, the temperature difference with the box air temperature becomes small, and cooling by heat exchange becomes impossible, so that the air heat exchange-type air conditioner 4 is stopped. In an intermediate-temperature region, the air heat exchange-type air conditioner 4 is operated to alleviate the cooling load in the box, thereby reducing the operating time of the refrigerant-type air conditioner 5. Through such control, it is possible to cool the heating-element accommodating box by reducing the amount of consumption of energy required for cooling.

(Twelfth Embodiment)

Figure 13:
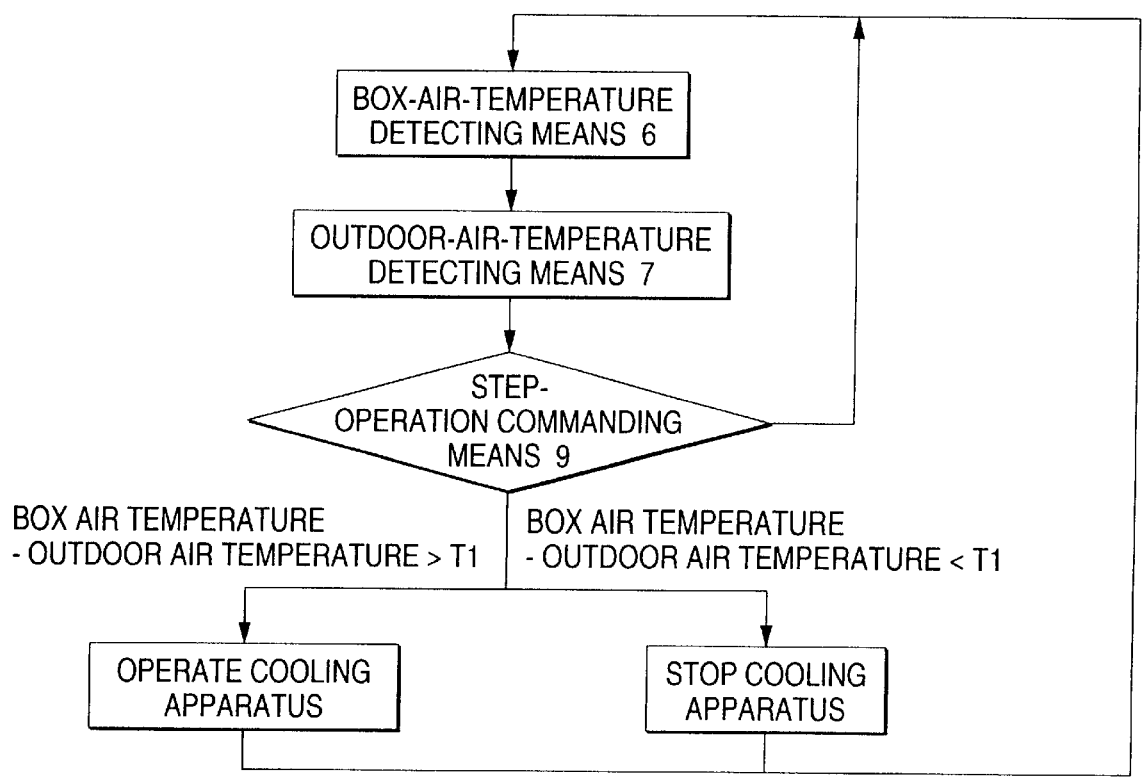
FIG. 13 is a flowchart illustrating a method of controlling the heating-element accommodating-box cooling apparatus in accordance with a twelfth embodiment of the invention.
Figure 14:
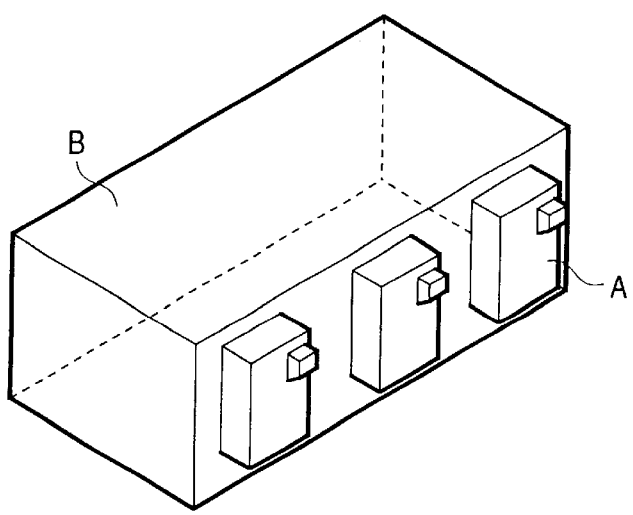
FIG. 14 is a diagram illustrating the state of installation of heating-element accommodating-box cooling apparatuses in accordance with the twelfth embodiment of the invention.

FIG. 13 shows control flow in accordance with a twelfth embodiment, and FIG. 14 shows the state of installation of heating-element accommodating-box cooling apparatuses.

As shown in FIG. 14, a plurality of heating-element accommodating-box cooling apparatuses are installed on the heating-element accommodating box.

Next, a description will be given of control flow.

The box-air-temperature detecting means 6 notifies a step-operation commanding means 9 of the box air temperature measured by the box air temperature sensor 1, while the outdoor-air-temperature detecting means 7 notifies the step-operation commanding means 9 of the outdoor air temperature measured by the outdoor air temperature sensor 2. If the difference between the box air temperature and the outdoor air temperature is greater than the preset temperature difference T1, the step-operation commanding means 9 operates one of the heating-element accommodating-box cooling apparatuses being stopped.

Next, if the step-operation commanding means 9 detects again that the difference between the box air temperature and the outdoor air temperature is still greater than the preset temperature difference T1, the step-operation commanding means 9 operates another one of the heating-element accommodating-box cooling apparatuses being stopped.

The above-described control is repeated until the step-operation commanding means 9 detects that the difference between the box air temperature and the outdoor air temperature is less than or equal to the preset temperature difference T1.

Meanwhile, in the case of stopping, if the step-operation commanding means 9 detects that the difference between the notified box air temperature and outdoor air temperature is less than a preset temperature difference T1, the step-operation commanding means 9 stops one of the heating-element accommodating-box cooling apparatuses being operated.

If the step-operation commanding means 9 detects again that the difference between the notified box air temperature and outdoor air temperature is still less than the preset temperature difference T1', the step-operation commanding means 9 stops another one of the heating-element accommodating-box cooling apparatuses being operated.

The above-described control is repeated until the step-operation commanding means 9 detects that the difference between the box air temperature and the outdoor air temperature is greater than or equal to the preset temperature difference T1'.

Through such control, it is possible to operate heating-element accommodating-box cooling apparatuses which are only necessary for maintaining the internal temperature of the heating-element accommodating box in a set temperature range, and excessive energy is not wasted.

In addition, by providing temperature differences for the temperature differences T1 and T1', it is possible to avoid the operation in which the heating-element accommodating-box cooling apparatuses repeat starting and stopping in short time periods.

(Thirteenth Embodiment)

FIG. 15 is a diagram of the correlation between the temperature and the air volume in accordance with a thirteenth embodiment, and FIG. 16 shows control flow.

As shown in FIG. 16, the box-air-temperature detecting means 6 notifies an air-volume setting means 10 of the box air temperature measured by the box air temperature sensor 1. In the event that the box air temperature has become higher than a preset box-air upper limit temperature T3, and there has arisen a risk of causing damage to the equipment inside the box, the air-volume setting means 10 effects emergency-mode operation by promptly increasing the number of revolution of the fan unit 3 to increase the air volume.

Consequently, the cooling capacity of the heating-element accommodating-box cooling apparatuses becomes large, and the box air temperature drops. When the box air temperature notified by the box-air-temperature detecting means 6 has become lower than a preset temperature T4 and a safety temperature region has been reached, the air-volume setting means 10 effects steady-mode operation by lowering the number of revolution of the fan unit 3 to return the air volume to the steady-state level.

In addition, by providing temperature differences for the temperature differences T3 and T4, it is possible to avoid the operation in which the heating-element accommodating-box cooling apparatuses repeat the increase or decrease of the air volume in short time periods.

By performing such control, it is possible to maintain the internal temperature of the box to a preset level or below, thereby making it possible to avoid causing damage to the equipment inside the box due to heat.

(Fourteenth Embodiment)

Figure 17:
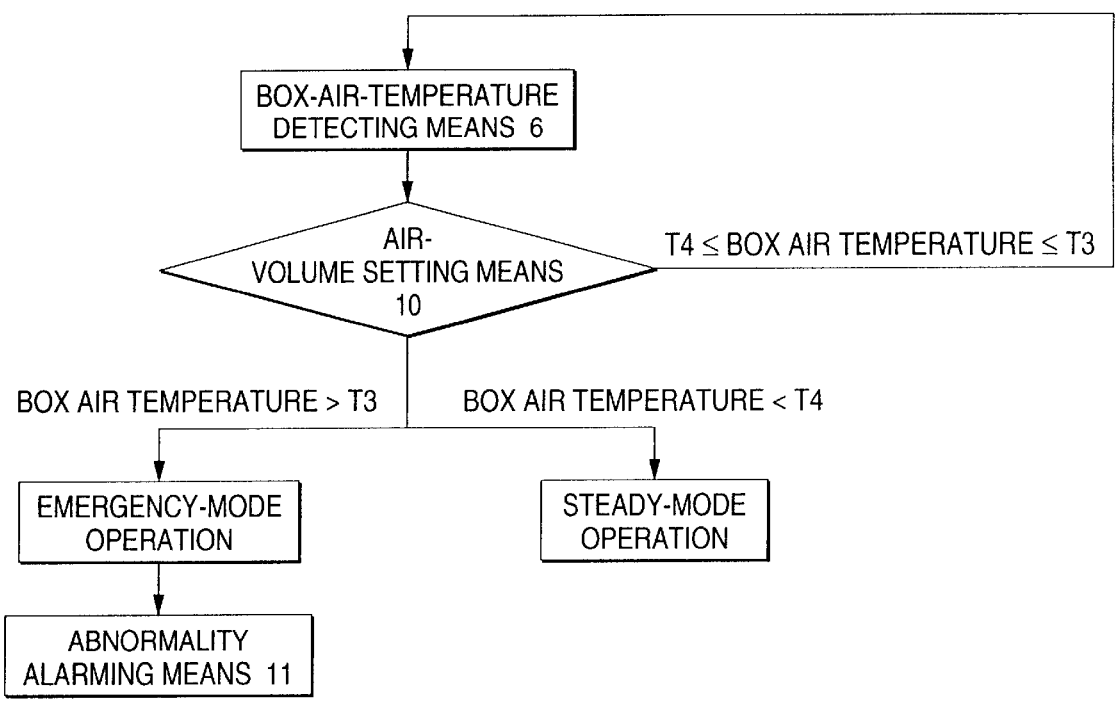
FIG. 17 is a flowchart illustrating a method of controlling the heating-element accommodating-box cooling apparatus in accordance with a fourteenth embodiment of the invention.

FIG. 17 shows control flow in accordance with a fourteenth embodiment.

As shown in the drawing, the air-volume setting means 10 notifies an abnormality alarming means 11 when the emergency-mode operation is effected.

The abnormality alarming means 11 refers to a device which directly notifies a facility manager, such as a buzzer, a lamp, or a seven-segment display, or a device which notifies a monitoring device by using a communication means.

As a result, the facility manager is able to cope with an emergency situation.

(Fifteenth Embodiment)

Figure 18:
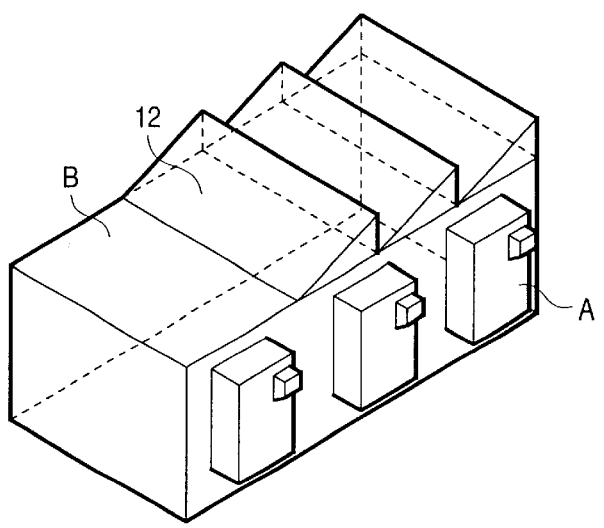
FIG. 18 is a diagram illustrating heating-element accommodating-box cooling apparatuses in accordance with a fifteenth embodiment of the invention.

FIG. 18 shows a fifteenth embodiment.

As shown in the drawing, solar cells 12 are mounted on a heating-element accommodating box B, and the generated electric power is utilized for operating heating-element accommodating-box cooling apparatuses A.

Consequently, part of the amount of consumption of energy required by the heating-element accommodating-box cooling apparatuses A for cooling can be borne, so that energy saving can be realized.

(Sixteenth Embodiment)

Figure 19:
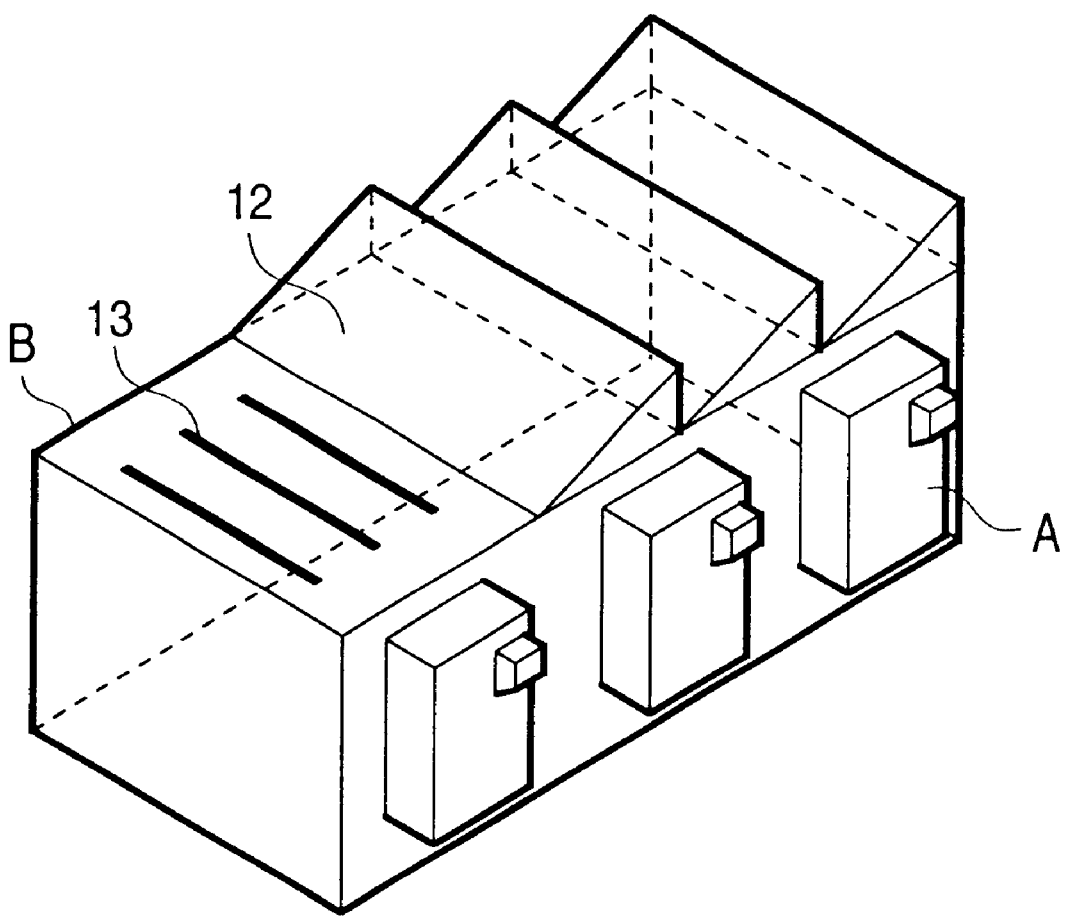
FIG. 19 is a diagram illustrating heating-element accommodating-box cooling apparatuses in accordance with a sixteenth embodiment of the invention.

FIG. 19 shows a sixteenth embodiment.

As shown in the drawing, an electronic cooling means 13 for effecting cooling by the Peltier effect is mounted on the heating-element accommodating box.

The heating-element accommodating box B is cooled by this electronic cooling means 13, and the cooling load borne by the heating-element accommodating-box cooling apparatuses A can be reduced. For this reason, the operating time of the heating-element accommodating-box cooling apparatuses can be reduced, so that energy saving can be realized.

It should be noted that although in this embodiment the arrangement has been shown in which the solar cells 12 are jointly used, it goes without saying that only the electronic cooling means 13 may be utilized.

As described above, in accordance with the invention, since a heating-element accommodating-box cooling apparatus capable of energy saving can be obtained, and the heating-element accommodating-box cooling apparatus is mounted on the panel of the heating-element accommodating box, advantages are obtained in that the installation work can be easily effected, and the space for installation of the cooling apparatus is not required within the box.

In addition, by virtue of the form of arrangement in which the rotating shaft of the fan unit is arranged in such a manner as to be parallel to the longitudinal direction of the heat exchange element and perpendicular to a blowing-out direction of the indoor air, the casing of the heating-element accommodating-box cooling apparatus can be made thin and compact, so that the execution at the time of installation of the cooling apparatus can be facilitated.

In addition, since air cooler is provided for effecting auxiliary cooling of the heating-element accommodating box when the outdoor air temperature is high, it is possible to cope with an increase in the amount of cooling required when the outdoor air temperature is high, while energy saving operation is performed when the outdoor air temperature is low.

In addition, the indoor air inlet and the indoor air outlet are formed as circular holes in terms of their shapes, and are disposed in the casing of the heating-element accommodating-box cooling apparatus. Hence, in operation, processing for forming openings in the panel of the box is facilitated at the time of installation of the heating-element accommodating-box cooling apparatus.

In addition, the indoor air inlet and the indoor air outlet are respectively provided with flanges, so that airtightness can be ensured with easy execution of installation even if the panel of the heating-element accommodating box is thick.

In addition, since the heat exchange plates of the heat exchange element are made impermeable to moisture. Hence, in operation, adverse effects of moisture due to vapor condensation and the like on the equipment inside the heating-element accommodating box do not occur.

In addition, by virtue of control in which when the outdoor air temperature is low, the operation of the air cooler is stopped and heat exchange is effect, whereas when the outdoor air temperature is high, heat exchange is not effected, but the air cooler is operated, energy saving can be realized since excess consumption of energy due to heat exchange and unnecessary operation of a refrigerating machine are not performed.

In addition, since the wiring between the heating-element accommodating box and the heating-element accommodating-box cooling apparatus is effected by making use of the indoor air inlet or the indoor air outlet, processing for providing a separate opening for the wiring in the heating-element accommodating-box cooling apparatus becomes unnecessary, thereby making it possible to reduce the number of steps in the execution of installation.

In addition, since the heating-element accommodating-box cooling apparatus is installed with its part or whole embedded in the panel and the door of the heating-element accommodating box, the projecting portion on the outer peripheral surface of the box can be made small.

In addition, by mounting the heating-element accommodating-box cooling apparatus on the ceiling of the heating-element accommodating box, it is possible to cope with a case where there is no installation space around outer peripheral side portions of the heating-element accommodating box.

As described above, control is provided such that when the outdoor air temperature is sufficiently low in comparison with the box air temperature, the refrigerant-type air conditioner is stopped, and the air heat exchange-type air conditioner is operated, whereas when the outdoor air temperature is high, the air heat exchange-type air conditioner is stopped, and the refrigerant-type air conditioner is operated. Accordingly, since the unnecessary refrigerant-type air conditioner is not operated, it is possible to realize energy saving.

In addition, by setting the number of heating-element accommodating-box cooling apparatuses operated to a minimum number required for the cooling load, it is possible to suppress the unnecessary consumption of energy.

In addition, if the box air temperature has higher than a preset temperature, by increasing the air volume of the fan unit of the heating-element accommodating-box cooling apparatus, it is possible to lower the internal temperature of the heating-element accommodating box during an emergency, thereby making it possible to avoid causing damage to the equipment inside the heating-element accommodating box due to the high temperature.

What is claimed is:

1. A cooling apparatus for an enclosed box that accommodates a heat producing element within an interior of the box, wherein the cooling apparatus is adapted for mounting on an exterior of the box and the cooling apparatus includes:

indoor air passage structure for receiving a flow of indoor air from the interior of the box to the cooling apparatus and for returning the flow of indoor air from the cooling apparatus to the interior of the box to circulate the indoor air;

outdoor air passage structure for receiving a flow of outdoor air from the ambient environment exterior of the box to the cooling apparatus and for returning the flow of outdoor air from the cooling apparatus to the ambient environment;

a partition plate, located along the flow of indoor air received and returned by the indoor air passage structure and located along the flow of outdoor air received and returned by the outdoor air passage structure, for preventing commingling of the indoor air flow and the outdoor air flow;

a fan unit, located along the flow of indoor air received and returned by the indoor air passage structure and located along the flow of outdoor air received and returned by the outdoor air passage structure, operative to move indoor air for the flow within the indoor air passage and to move outdoor air for the flow within the outdoor air passage; and a heat exchange element, located along the flow of indoor air received and returned by the indoor air passage structure and located along the flow of outdoor air received and returned by the outdoor air passage structure, through which the indoor air flow passes and the outdoor air flow passes, without commingling the air flows, to exchange heat between the indoor air and the outdoor air.

2. A cooling apparatus for an enclosed box that accommodates a heat producing element within an interior of the box, wherein the cooling apparatus is adapted for mounting on an exterior of the box and the cooling apparatus includes:

indoor air passage structure for receiving a flow of indoor air from the interior of the box to the cooling apparatus and for returning the flow of indoor air from the cooling apparatus to the interior of the box for circulating the indoor air, the indoor air passage structure being provided to direct the returning indoor air into the box in a first direction;

outdoor air passage structure for receiving a flow of outdoor air from the ambient environment exterior of the box to the cooling apparatus and for returning the flow of outdoor air from the cooling apparatus to the ambient environment, the indoor air passage structure and the outdoor air passage structure being provided to prevent commingling of the indoor air flow and the outdoor air flow;

a heat exchange element, located along the flow of indoor air received and returned by the indoor air passage structure and located along the flow of outdoor air received and returned by the outdoor air passage structure, through which the indoor air flow passes and the outdoor air flow passes, without commingling the air flows, to exchange heat between the indoor air and the outdoor air, the heat exchange element having a longitudinal extent along a second direction that is perpendicular to the first direction; and a fan unit, located along the flow of indoor air received and returned by the indoor air passage structure and located along the flow of outdoor air received and returned by the outdoor air passage structure, including a rotating first portion operative to move indoor air for the flow within the indoor air passage, a rotating second portion to move outdoor air for the flow within the outdoor air passage, and a rotating shaft driving the first and second rotating portions, the shaft having a longitudinal extent along the second direction that is perpendicular to the first direction.

3. A cooling apparatus as set forth in either claim 1 or 2, further including an air cooler, located along the flow of indoor air received and returned by the indoor air passage structure, for cooling the indoor air from the interior of the box when the outdoor air from the ambient environment is at a high temperature.

4. A cooling apparatus as set forth in either claim 1 or 2, wherein a cross-section of the indoor air passage structure that receives the flow of indoor air from the interior of the box has a circular shape, and a cross-section of the indoor air passage structure that returns the flow of indoor air from the cooling apparatus to the interior has a circular shape.

5. A cooling apparatus as set forth in claim 4, wherein the portion of the indoor air passage structure that receives the flow of indoor air from the interior of the box has a flange, and the indoor air passage structure that returns the flow of indoor air from the cooling apparatus to the interior has a flange.

6. A cooling apparatus as set forth in either claim 1 or 2, wherein the heat exchange element is made of material impermeable to moisture.

* * * * *

UNITED STATES PATENT AND TRADEMARK OFFICE
CERTIFICATE OF CORRECTION

PATENT NO.    : 6,612,365 B1
DATED         : September 2, 2003
INVENTOR(S)   : Kazuki Saishu et al.

It is certified that error appears in the above-identified patent and that said Letters Patent is hereby corrected as shown below:

Title page,
Item [56], References Cited, U.S. PATENT DOCUMENTS, please insert the following references therefor:

| | | | |
|---|---|---|---|
| -- 5,220,955 | 6/1993  | Stokes          | 165/164x |
| 5,117,563    | 6/1992  | Castonguay      | 165/54x  |
| 4,377,201    | 3/1983  | Kruse et al.    | 165/54x  |
| 4,377,400    | 3/1983  | Okamoto et al.  | 165/54x  |
| 4,389,857    | 6/1983  | Svendsen        | 165/54x  |
| 4,449,570    | 5/1984  | Locker          | 165/54x  |
| 4,503,902    | 3/1985  | Zolik           | 165/164x |
| 4,513,809    | 4/1985  | Schneider et al.| 165/54   |
| 4,616,696    | 10/1986 | Brundrett et al.| 165/54   |
| 4,711,293    | 12/1987 | Niwa et al.     | 165/54x  |
| 5,257,736    | 11/1993 | Roy             | 165/54x  |
| 5,490,557    | 2/1996  | Taylor          | 165/54   |
| 5,931,001    | 8/1999  | Watanabe et al. | 165/54x  |
| 6,176,305 B1 | 1/2001  | Haglid          | 165/54x  |
| 6,209,622 B1 | 4/2001  | Lagace et al.   | 165/54x -- |

FOREIGN PATENT DOCUMENTS, please insert the following references therefor:

| | | |
|---|---|---|
| -- DE | 30 06 318 A1  | 8/1981 |
| DT    | 25 56 660 A1  | 7/1976 |
| DE    | 27 29 862 A1  | 1/1978 |
| JP    | 53-100648     | 9/1978 |
| EP    | 0 060 539 A1  | 9/1982 |
| JP    | 58-55637      | 4/1983 |
| EP    | 0 96 175 A2   | 10/1984 |
| JP    | 63-123940 A   | 5/1988 |
| UK    | 2 176 887 A   | 1/1987 |
| EP    | 0 366 642 A2  | 5/1990 |
| DE    | 40 02 560 A1  | 8/1991 -- |

UNITED STATES PATENT AND TRADEMARK OFFICE
CERTIFICATE OF CORRECTION

PATENT NO. : 6,612,365 B1
DATED : September 2, 2003
INVENTOR(S) : Kazuki Saishu et al.

It is certified that error appears in the above-identified patent and that said Letters Patent is hereby corrected as shown below:

<u>Title page cont'd,</u>
Item [57], ABSTRACT, please delete the ABSTRACT, and insert the following therefor:
-- A cooling apparatus for a box that accommodates a heat producing element within an interior of the box. The apparatus is adapted for mounting on an exterior of the box. Indoor air passage structure is for receiving a flow of indoor air from the box interior to the cooling apparatus and returning the flow of indoor air. Outdoor air passage structure is for receiving a flow of outdoor air from the exterior environment and returning the flow of outdoor air. A partition plate, located along the two air flows, prevents commingling of the two air flows. A fan unit, located along the two air flows, is operative to move the two air flows. A heat exchange element, located along the flow of indoor air and through which the two flows pass without commingling, exchanges heat between the indoor air and the outdoor air. --

Figure 20:
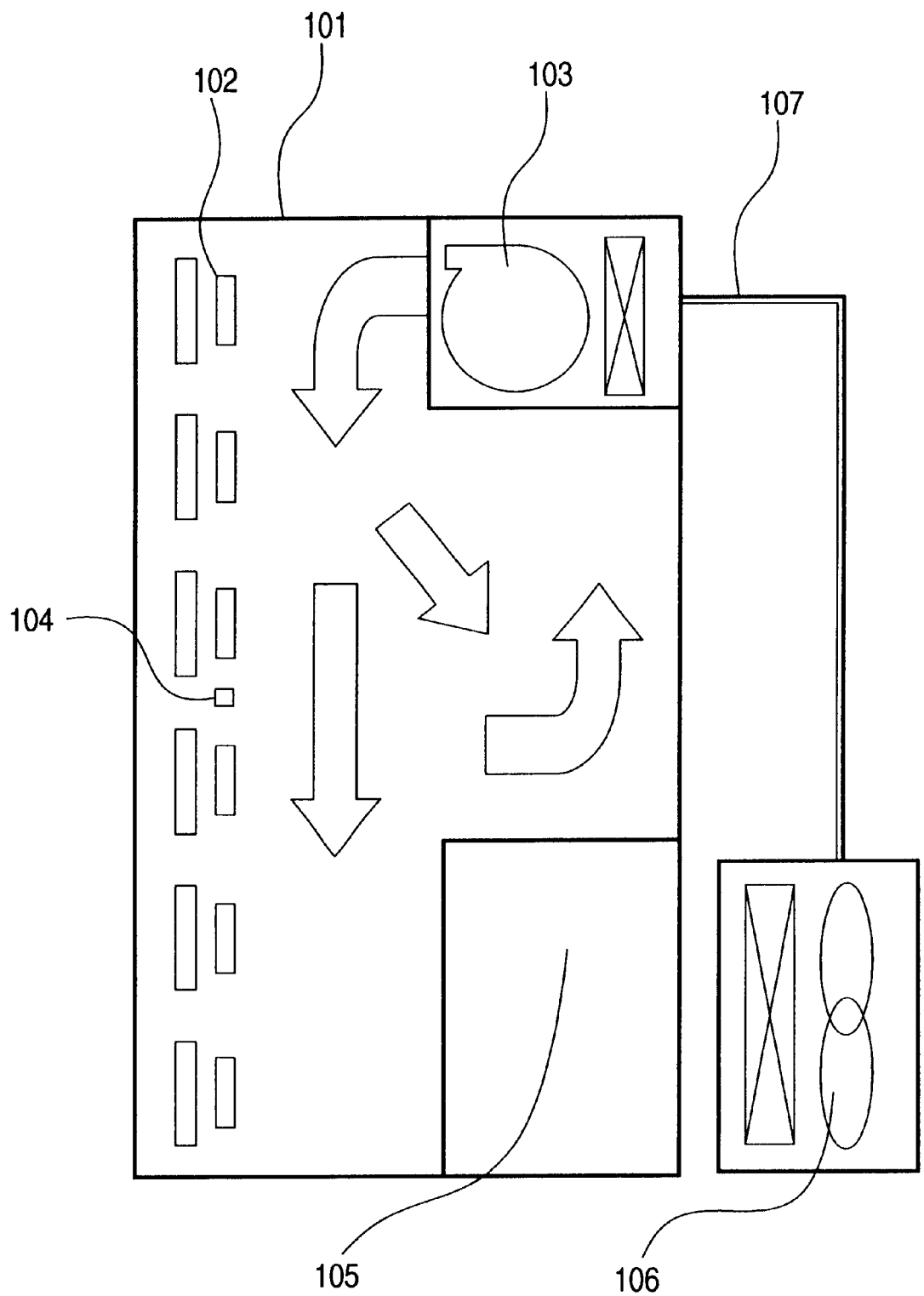
FIG. 20 is a schematic cross-sectional view illustrating the structure of a conventional heating-element accommodating-box cooling apparatus.
Figure 3:
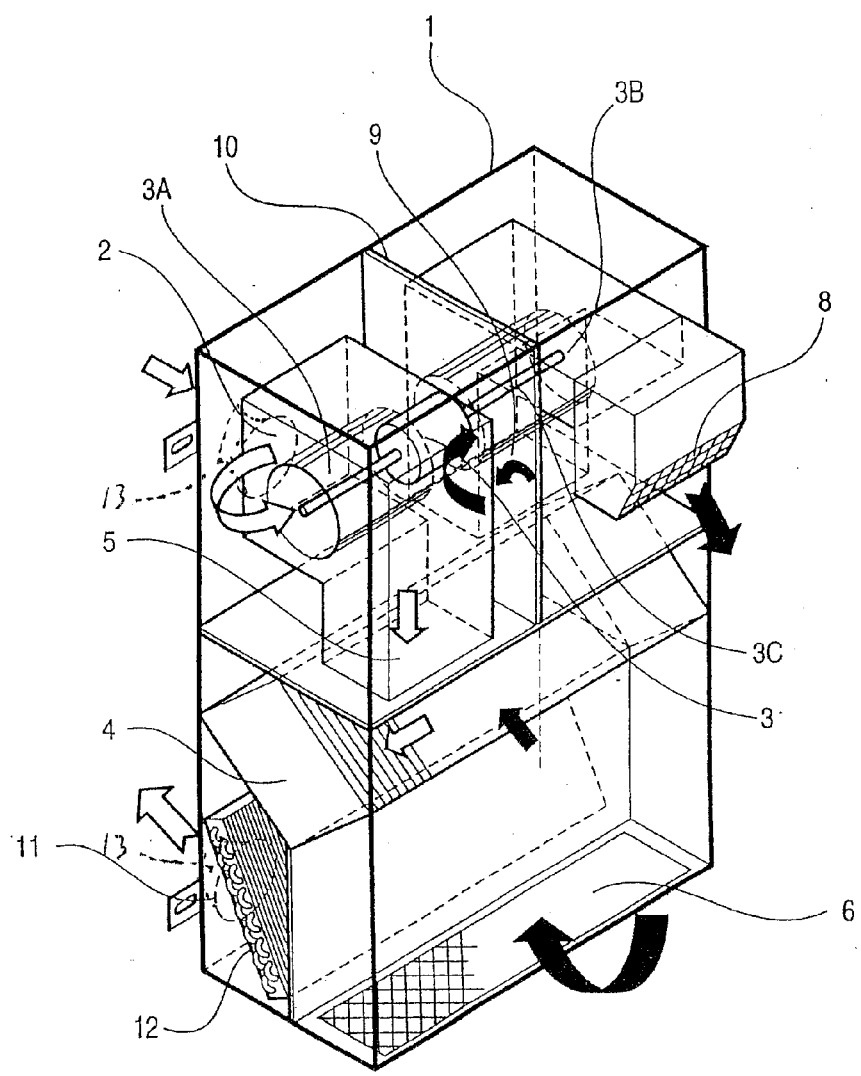
Figure 20:
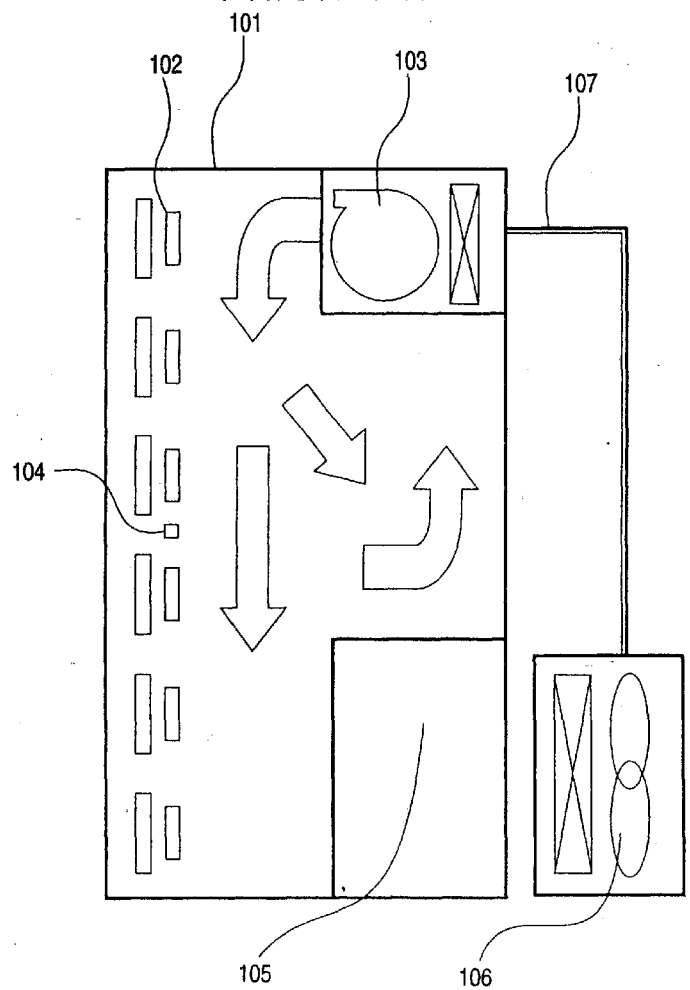

<u>Drawings,</u>
Please delete Fig. 3, as shown on Sheet 3 of 16 of the drawings, and insert therefor new Fig. 3 (attached).
Please delete Fig. 20, as shown on Sheet 16 of 16 of the drawings, and insert therefor new Fig. 20 (attached).

<u>Column 5,</u>
Line 35, after "flanges", please insert therefor -- . -- (period).

<u>Column 12,</u>
Line 9, please delete "T1", and insert therefor -- T1' --.

Signed and Sealed this

Tenth Day of February, 2004

JON W. DUDAS
*Acting Director of the United States Patent and Trademark Office*

⇨ FLOW IN INDOOR AIR PASSAGE

➡ FLOW IN OUTDOOR AIR PASSAGE

UNITED STATES PATENT AND TRADEMARK OFFICE
CERTIFICATE OF CORRECTION

PATENT NO. : 6,612,365 B1
DATED : September 2, 2003
INVENTOR(S) : Kazuki Saishu et al.

It is certified that error appears in the above-identified patent and that said Letters Patent is hereby corrected as shown below:

<u>Title page,</u>
Item [73], Assignee, please delete "Matsushita Electric Industrial Co., Ltd.", and insert therefor -- Matsushita Seiko Co., Ltd. --.

Signed and Sealed this

First Day of February, 2005

JON W. DUDAS
*Director of the United States Patent and Trademark Office*